United States Patent
Fujiishi

(10) Patent No.: US 7,348,235 B2
(45) Date of Patent: Mar. 25, 2008

(54) SEMICONDUCTOR DEVICE AND METHOD OF MANUFACTURING THE SAME

(75) Inventor: Yoshitaka Fujiishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 76 days.

(21) Appl. No.: 11/411,921

(22) Filed: Apr. 27, 2006

(65) Prior Publication Data

US 2006/0246676 A1  Nov. 2, 2006

(30) Foreign Application Priority Data

Apr. 28, 2005  (JP) ............................. 2005-131821

(51) Int. Cl.
*H01L 21/8242* (2006.01)
(52) U.S. Cl. .................... 438/243; 438/247; 438/248; 438/386; 257/E27.092
(58) Field of Classification Search ........ 438/243–249, 438/386–392; 257/E27.092, E27.093
See application file for complete search history.

(56) References Cited

U.S. PATENT DOCUMENTS

| | | | |
|---|---|---|---|
| 4,894,695 A | * | 1/1990 | Ishii et al. .................. 257/301 |
| 5,302,542 A | | 4/1994 | Kishi et al. |
| 6,468,855 B2 | | 10/2002 | Leung et al. |
| 6,573,548 B2 | | 6/2003 | Leung et al. |

FOREIGN PATENT DOCUMENTS

| | | |
|---|---|---|
| JP | 62-51249 | 3/1987 |
| JP | 5-315564 | 11/1993 |
| JP | 2004-311853 | 11/2004 |
| WO | WO 02/061806 A2 | 8/2002 |

* cited by examiner

*Primary Examiner*—H. Jey Tsai
(74) *Attorney, Agent, or Firm*—McDermott Will & Emery LLP

(57) ABSTRACT

An isolation insulation film is formed in an isolation trench in an upper portion of a silicon substrate. The isolation insulation film has an opening by which inner walls and bottom of the isolation trench are exposed. A lower diffusion layer serving as a lower electrode of capacitors of DRAM cells extends into the inner walls of the isolation trench exposed by the opening, and a dielectric layer is formed in almost constant thickness on the inner walls and bottom of the isolation trench exposed by the opening. An upper electrode is partially buried in the opening. A channel cut layer is formed in the vicinity of the bottom of the opening.

8 Claims, 19 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor memory having a capacitor such as DRAM (Dynamic Random Access Memory).

2. Description of the Background Art

Known among conventional semiconductor memories is a DRAM cell made up of a MOS (Metal-Oxide Semiconductor) transistor and a capacitor whose lower electrode is an impurity diffusion layer connected to a source/drain region of the MOS transistor (cf. National Publication of Translation No. 2004-527901 and Japanese Patent Application Laid-Open No. 2004-311853). A DRAM cell described in the National Publication of Translation No. 2004-527901 includes an isolation insulation film (field insulation film) provided in an upper surface of a semiconductor substrate with a recess (cavity) formed in its upper portion, and sidewalls of the semiconductor substrate are exposed by the recess. The capacitor of the DRAM cell extends to reach the sidewalls exposed by the recess, increasing the effective area of the capacitor to produce an increase in capacity.

The DRAM cell of such structure might be damaged with its upper portion unnecessarily etched in creating the above-mentioned recess. When the upper portion of the recess is damaged, the capacitor extending into the recess degrades in electric characteristics, resulting in degradation in reliability of the DRAM cell. Therefore, a method of manufacturing a DRAM cell capable of preventing unnecessary etching of the upper portion of a recess in which a capacitor is to be formed is proposed (cf. Japanese Patent Application Laid-Open No. 62-51249 (1987)).

Further, a technique of cutting down a substrate deeply to form a capacitor structure therein in order to increase the capacity of a capacitor of a DRAM cell (cf. Japanese Patent Application Laid-Open No. 5-315564 (1993)).

In the above-described DRAM cell, the recess in the isolation insulation film provided to increase the effective area of the capacitor has conventionally been at a depth about half the depth of an isolation trench. The deeper the recess, the larger the effective area of the capacitor, however, too deep recess will damage the isolation insulation film in functionality, causing a parasitic MOS transistor to be formed between adjacent cells. As a result, charge leakage occurs between the adjacent cells, which degrades the DRAM cell in reliability.

Further, forming the capacitor structure in a step different from the step of forming an element isolation section and a transistor section will significantly increase the number of manufacturing steps, which in turn increases chip costs.

SUMMARY OF THE INVENTION

An object of the present invention is to provide a semiconductor memory capable of increasing the effective area of a capacitor more than a conventional capacitor as well as preventing an increase in the number of manufacturing steps while suppressing charge leakage between memory cells, and a method of manufacturing such semiconductor memory.

According to a first aspect of the present invention, a semiconductor device having a memory cell and a peripheral circuit formed in a semiconductor substrate includes, in each of a memory cell area in which the memory cell is formed and in a peripheral circuit area in which the peripheral circuit is formed, a trench formed in an upper portion of the semiconductor substrate, an active region defined by the trench in the semiconductor substrate, and an isolation insulation film formed in the trench. The memory cell includes a capacitor having a first electrode which is an impurity diffusion layer formed to extend from an upper surface of the active region to an inner wall of the trench, a dielectric layer extending from the inner wall to bottom of the trench and having almost equal thickness on the inner wall and bottom of the trench, and a second electrode at least partially buried in the trench. The trench in the peripheral circuit area and the trench in the memory cell area have almost equal depth.

The capacitor is formed deeply in the trench, which increases the effective area of the capacitor. Further, the trench in the memory cell area in which the capacitor is formed can be formed in the same step as the trench in the peripheral circuit, which simplifies the steps. Furthermore, forming a channel cut layer in the vicinity of the bottom of the trench prevents a parasitic transistor from being formed under the opening, which can suppress the occurrence of charge leakage.

According to a second aspect of the invention, the semiconductor device having a memory cell and a peripheral circuit formed in a semiconductor substrate includes, in each of a memory cell area in which the memory cell is formed and in a peripheral circuit area in which the peripheral circuit is formed, a trench formed in an upper portion of the semiconductor substrate, an active region defined by the trench in the semiconductor substrate, and an isolation insulation film formed in the trench. The memory cell includes a capacitor having a first electrode which is an impurity diffusion layer formed to extend from an upper surface of the active region to an inner wall of the trench, a dielectric layer extending from the inner wall to bottom of the trench and having almost equal thickness on the inner wall and bottom of the trench, and a second electrode at least partially buried in the trench. Part of the trench in which the second electrode is buried in the memory cell area is deeper than the trench in the peripheral circuit area.

The capacitor is formed deeply in the trench, which increases the effective area of the capacitor. Further, forming a channel cut layer in the vicinity of the bottom of the trench prevents a parasitic transistor from being formed under the opening. This can suppress the occurrence of charge leakage.

According to a third aspect of the invention, the semiconductor device includes a trench formed in an upper portion of a semiconductor substrate, an isolation insulation film formed in the trench, an active region defined by the trench, and a capacitor including a first electrode which is an impurity diffusion layer formed in the active region, a dielectric layer formed on a surface of the impurity diffusion layer and a second electrode formed on the dielectric layer. The impurity diffusion layer and the dielectric layer extend from an upper surface of the active region to an inner wall of the trench. The second electrode is at least partially buried in the trench. The semiconductor substrate includes a first channel cut layer formed in the vicinity of the bottom of the trench and a second channel cut layer formed locally under the part of the second electrode buried in the trench in a deeper position than the first channel cut layer.

The semiconductor device can be manufactured by almost the same number of steps in the conventional manufacturing method. Further, providing the first channel cut layer in the vicinity of the bottom of the trench prevents a parasitic transistor from being formed even with the second electrode formed deeply in the trench. This can suppress the occurrence of charge leakage.

According to a fourth aspect of the invention, the method of manufacturing a semiconductor device having a memory cell and a peripheral circuit formed in a semiconductor substrate, the memory cell including a capacitor with a first electrode which is an impurity diffusion layer formed in the semiconductor substrate, includes the following steps (a) to (f). The step (a) is to form a trench in an upper portion of the semiconductor substrate in each of a memory cell area in which the memory cell is formed and a peripheral circuit area in which the peripheral circuit is formed in the semiconductor substrate. The step (b) is to form an isolation insulation film in the trench in each of the memory cell area and the peripheral circuit area. The step (c) is to form the impurity diffusion layer to be the first electrode on an inner wall of the trench in a capacitor region in which the capacitor is to be formed in the memory cell area. The step (d) is to remove the isolation insulation film in the capacitor region to create an opening by which the inner wall and bottom of the trench are exposed. The step (e) is to form a dielectric layer on the inner wall and bottom of the trench exposed by the opening. The step (f) is to form a second electrode on the dielectric layer including the inside of the opening.

The opening to which the capacitor extends is formed deeply to reach the bottom of the trench, which increases the effective area of the capacitor. Further, forming a channel cut layer in the vicinity of the bottom of the trench prevents a parasitic transistor from being formed under the opening. This can suppress the occurrence of charge leakage.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
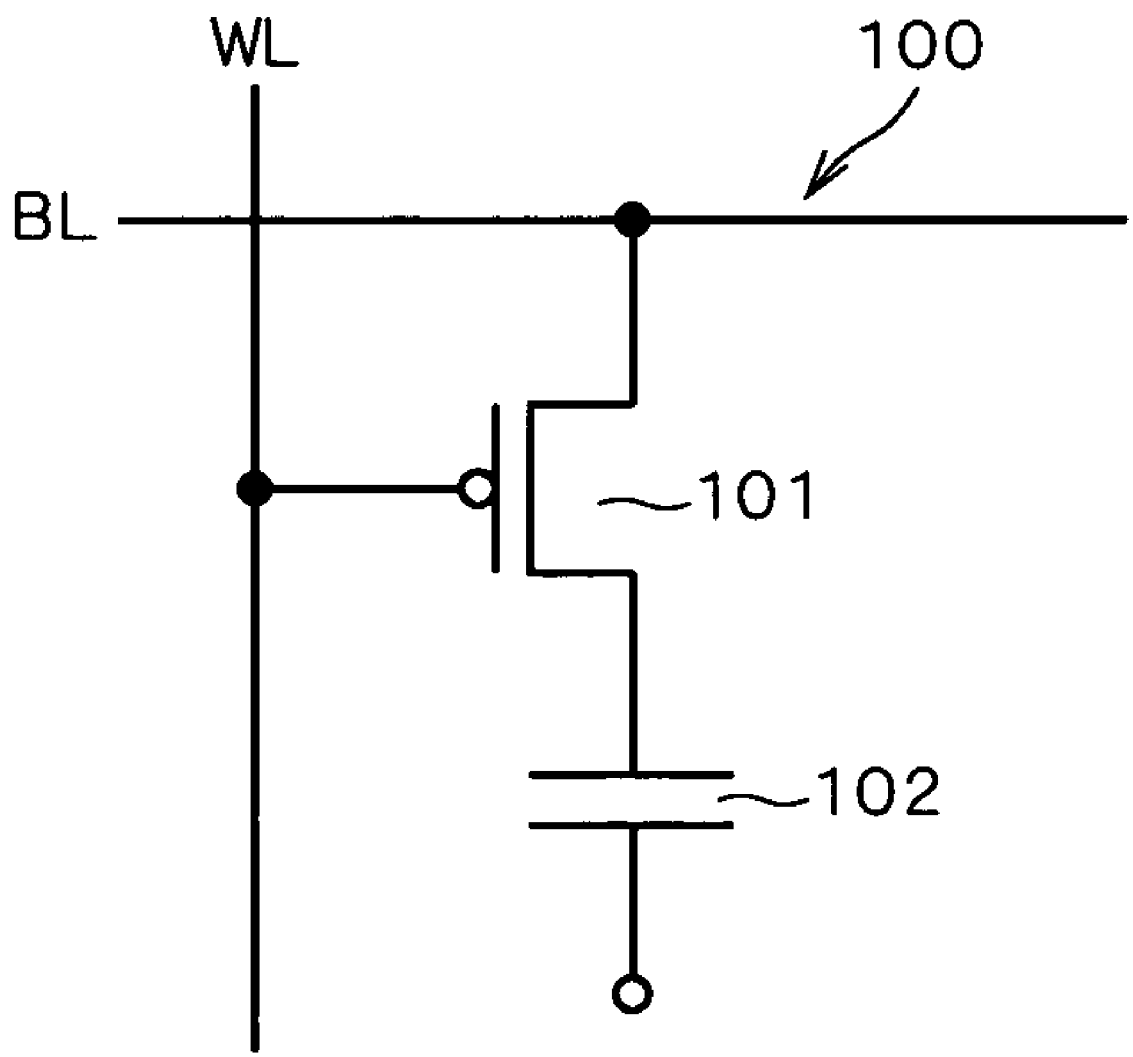
FIG. 1 is a circuit diagram showing a general DRAM cell.

FIG. 1 is a circuit diagram showing a general DRAM cell. A DRAM cell 100 is made up of a PMOS transistor 101 serving as an access transistor for writing, refreshing and reading data and a capacitor 102 for storing an amount of electric charge corresponding to data. The PMOS transistor 101 has its gate terminal connected to a word line WL, one of its source/drain terminals connected to a bit line BL, and the other one connected to one terminal of the capacitor 102. The capacitor 102 has its other terminal connected to a predetermined power source.

Figure 2:
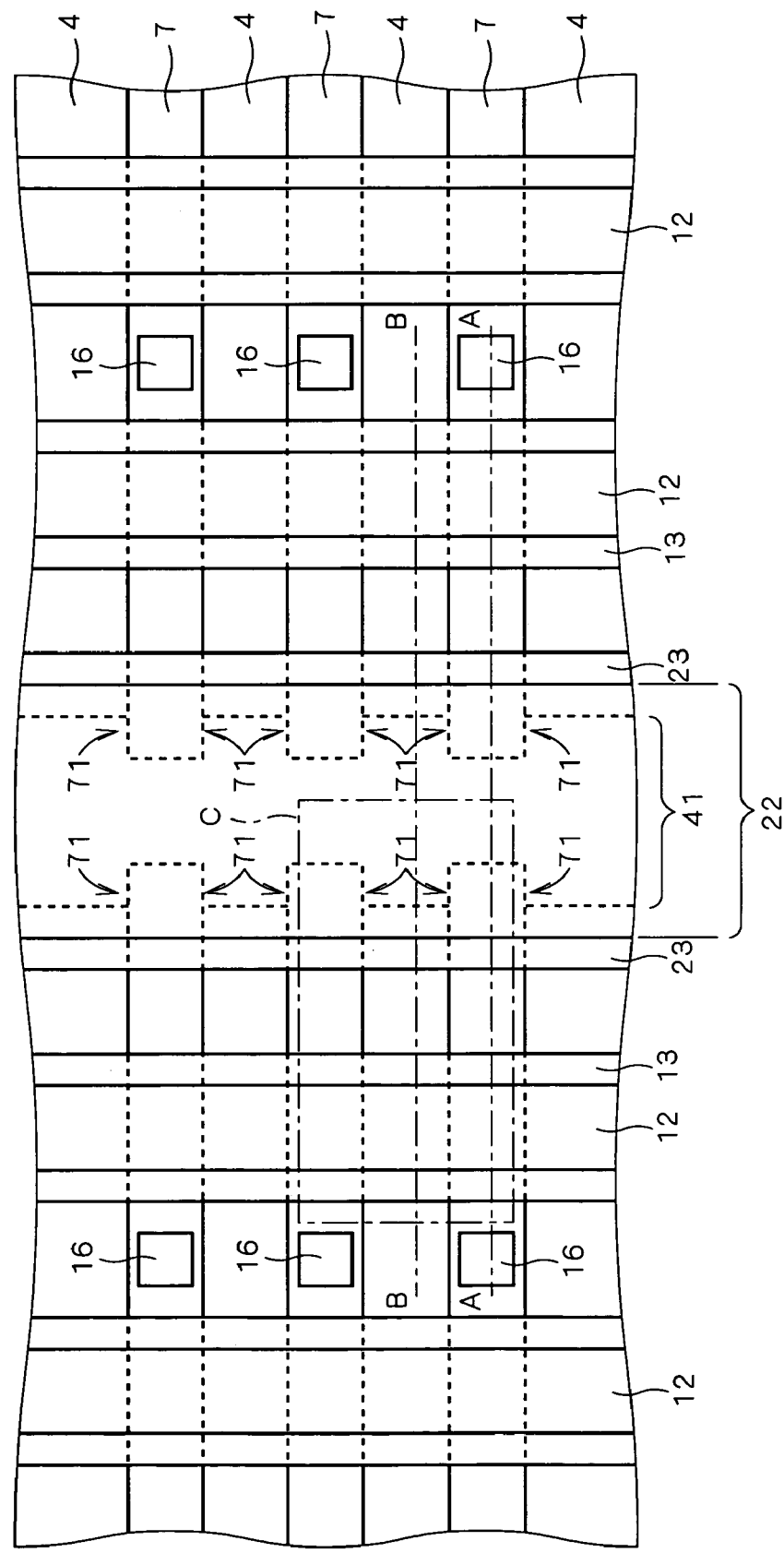
FIG. 2 is a sectional view showing a DRAM cell provided for a semiconductor memory according to a first preferred embodiment of the present invention.
Figure 3A:
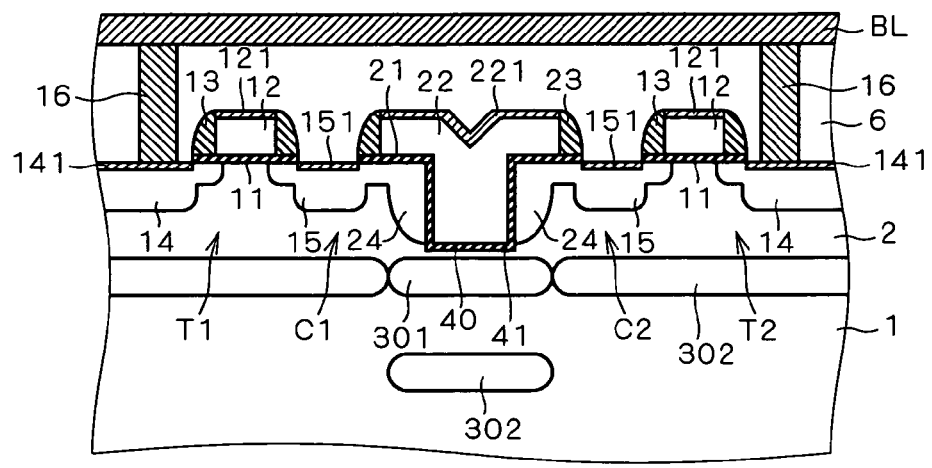
FIGS. 3A-3C, 4A-4C, 5A-5C, 6A-6C, 7A-7C, 8A-8C, 9A-9C and 10A-10C are process drawings showing a method of manufacturing the DRAM cell according to the first preferred embodiment.
Figure 3B:
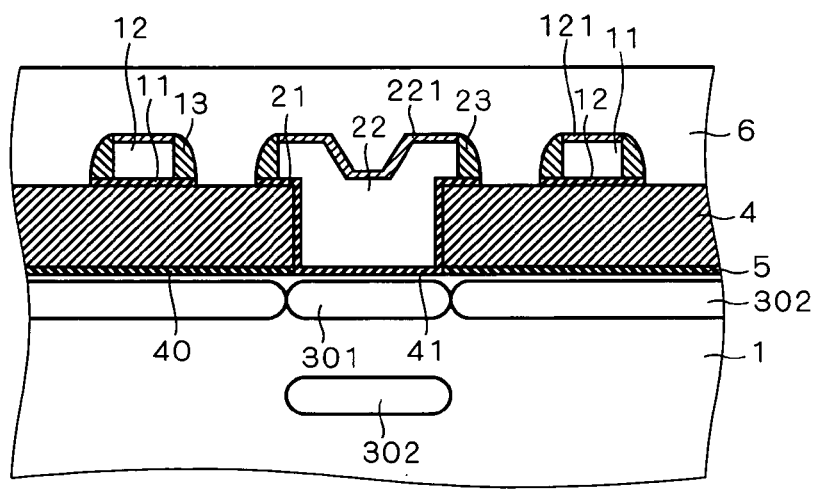
Figure 3C:
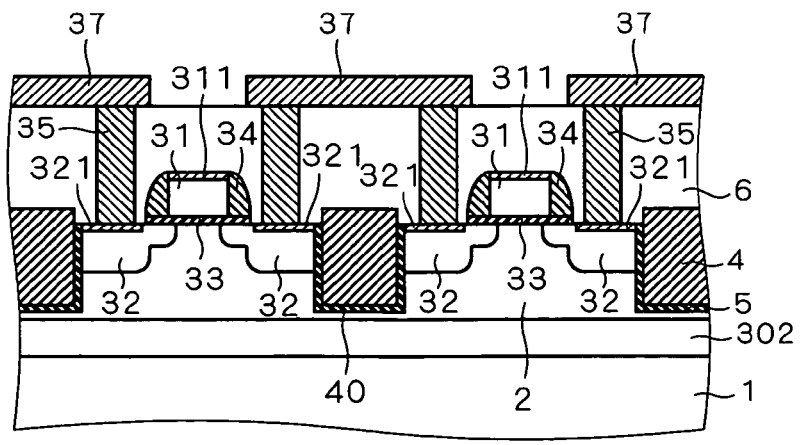

FIGS. 2 and 3A-3C show the structure of a semiconductor memory according to the first preferred embodiment. More specifically, FIG. 2 is a top view of a DRAM cell array provided for the semiconductor memory. FIGS. 3A and 3B are sectional views taken along the lines A-A and B-B shown in FIG. 2, respectively. FIG. 3C is a sectional view of a PMOS transistor (hereinafter referred to as "a peripheral transistor") in a peripheral circuit (not shown in FIG. 2) such as a logic portion of the semiconductor memory. In these drawings, like elements are indicated by the same reference characters.

FIG. 3A is a sectional view of two DRAM cells adjacent to each other in a direction in which the bit line BL extends (i.e., along the line A-A shown in FIG. 2). More specifically, the left DRAM cell shown in FIG. 3A is made up of a PMOS transistor T1 which is a MIS (Metal-Insulator-Semiconductor) transistor and a capacitor C1, and the right DRAM cell shown in FIG. 3A is made up of a PMOS transistor T2 and a capacitor C2. FIG. 3B is a sectional view of an element isolation region between DRAM cells adjacent to each other in a direction in which the word line WL extends (corresponds to a gate electrode 12 which will be described later).

In the present embodiment, the DRAM cells and peripheral circuit are formed in a P-type silicon substrate 1. An N well 2 is formed in a DRAM cell area and a P-type channel peripheral transistor area shown in FIG. 3C.

As shown in FIG. 3A, the PMOS transistors T1 and T2 are each made up of a gate oxide film 11, polysilicon gate electrode 12 formed thereon, sidewalls 13 formed on side surfaces of the gate electrode 12 and source/drain regions 14 and 15 formed in the surface of the silicon substrate 1, on both sides of the gate electrode 12.

Silicide layers 121, 141 and 151 are formed on the gate electrode 12, source/drain regions 14 and 15, respectively. The silicide layer 151 serves to reduce a connection resistance between access transistors (PMOS transistors T1, T2) and capacitors (capacitors C1, C2), which contributes to higher speed of the DRAM cell. The source/drain region 14 is connected to a contact 16 connected to the bit line BL, with the silicide layer 141 interposed therebetween.

The capacitors C1 and C2 shares an upper electrode 22 (second electrode), and each have a P-type impurity diffusion layer (hereinafter referred to as a "lower diffusion layer") 24 serving as a lower electrode (first electrode) and an insulation film (hereinafter referred to as a "dielectric layer") 21 serving as a dielectric layer between the upper electrode 22 and lower diffusion layer 24. A silicide layer 221 is formed on top of the upper electrode 22. The P-type lower diffusion layer 24 is connected to the P-type source/drain region 15. In other words, the lower diffusion layer 24 is electrically connected to the source/drain region 15, and serves as an electrode connected to the source/drain terminals of PMOS transistor 101 in the capacitor 102 shown in FIG. 1.

Two peripheral transistors shown in FIG. 3C each have almost the same structure as the PMOS transistors T1 and T2. More specifically, the peripheral transistors are each made up of a gate oxide film 33, a polysilicon gate electrode 31 formed thereon, sidewalls 34 formed on both side surfaces of the gate electrode 31 and source/drain regions 32 formed in the surface of the silicon substrate 1 on the both sides of the gate electrode 31. Silicide layers 311 and 321 are formed on the gate electrode 31 and source/drain regions 32, respectively. The source/drain regions 32 are each connected to a contact 35 which is connected to a predetermined interconnect wire, with the silicide layer 321 interposed therebetween.

An isolation trench 40 called STI (shallow trench isolation) on which an isolation insulation film 4 is to be formed is formed in the upper portion of the silicon substrate 1. The isolation trench 40 (isolation insulation film 4) is formed in each of the DRAM cell area and peripheral circuit area, and define active regions 7 on which semiconductor devices are respectively formed, as shown in FIG. 2. The isolation insulation film 4 is a high density plasma oxide film, and contains an oxide film 5 which is a thin thermal oxide film on the interface with the semiconductor substrate. In the present embodiment, however, as shown in FIGS. 3A and 3B, the isolation insulation film 4 is provided with an opening 41 under the upper electrode 22 of the capacitors C1 and C2 by which the inner walls and bottom of the isolation trench 40 are exposed (in the section shown in FIG. 3A, the isolation insulation film 4 has completely been removed).

As shown in FIG. 3A, the lower diffusion layer 24 of the capacitors C1 and C2 extends from the upper surface of the silicon substrate 1 to the inner walls of the isolation trench 40 (i.e., inner walls of the opening 41). The dielectric layer 21 is formed extending from the upper surface of the silicon substrate 1 directly to the inner walls and bottom of the isolation trench 40 (i.e., inner walls and bottom of the opening 41) in almost constant thickness (that is, the dielectric layer 21 has almost equal thickness on the inner walls and bottom of the isolation trench 40, which is almost equal to the gate oxide film 11 of the PMOS transistors T1 and T2 and the gate oxide film 33 of the peripheral circuit in thickness). Then, part of the upper electrode 22 is buried into the opening 41. This structure allows not only the upper surface of the silicon substrate 1 but also the inner walls of the isolation trench 40 contribute to the effective area of the capacitors C1 and C2, so that the capacity of the capacitors C1 and C2 can be increased.

The opening 41 is provided under the upper electrode 22 between DRAM cells adjacent to each other in a direction in which the gate electrode 12 extends as shown in FIG. 3B, and inner walls (not shown in FIG. 3B but indicated as 71 in FIG. 2) of the isolation trench 40 are exposed by the opening 41. The lower diffusion layer 24 and dielectric layer 21 are also formed on the inner walls 71. As a result, the inner walls 71 also contribute to the effective area of the capacitors C1 and C2, so that the capacity of the capacitors C1 and C2 can be further increased.

A channel cut layer 302 is formed in a region in the vicinity of the bottom of the isolation insulation film 4 in the N well 2 in which the DRAM cells and peripheral transistors are formed. As shown in FIGS. 3A and 3B, the channel cut layer 302 is formed locally in a deep position under and away from the bottom of the opening 41 in which the capacitors C1 and C2 are formed. To complement the channel cut layer 302, a channel cut layer 301 is formed in the vicinity of the bottom of the opening 41. That is, the channel cut layer according to the present embodiment locally has a two-level structure made up of the channel cut layer (hereinafter referred to as a "first channel cut layer") 301 and the channel cut layer (hereinafter referred to as a "second channel cut layer") 302 under the opening 41.

As described above, the conventional DRAM cell achieves an increase in effective area of capacitors by forming a recess in the upper portion of an isolation insulation film and drawing the capacitors to extend into the recess. In such conventional structure, however, too deep recess causes a parasitic MOS transistor to be formed under the recess (between adjacent cells) to result in charge leakage between the cells. To prevent this, the recess needs to be formed at a depth about half the depth of the isolation trench at most. In other words, in such conventional structure, there is a limit on the depth of the recess that can be created in the isolation insulation film, and the recess cannot be formed deeply like the opening 41 shown in FIG. 3A of the present embodiment.

In contrast, according to the present embodiment, forming the first channel cut layer 301 in the vicinity of the bottom of the opening 41 can prevent a parasitic MOS transistor from being formed under the opening 41. Accordingly, as shown in FIG. 3A, charge leakage between adjacent cells can be suppressed even by completely removing part of the isolation insulation film 4 under the upper electrode 22, forming the opening 41 to reach the bottom of the isolation trench 40, and making the capacitors C1 and C2 extend into the opening 41. That is, the effective area of the capacitors C1 and C2 can be increased more than in the conventional structure while suppressing charge leakage between adjacent cells.

However, when the first channel cut layer 301 is not enough to suppress the generation of a parasitic MOS transistor, the upper electrode 22 needs to be always kept at a positive potential during operation of the semiconductor memory. The parasitic MOS transistor generated between the capacitors C1 and C2 is of P-channel type, and is therefore difficult to turn on while the upper electrode 22 is kept at a positive potential, which can prevent charge leakage. In this case, the semiconductor memory can be operated normally by setting, for example, the H (High) level of an input/output signal of DRAM cells at supply potential, L (Low) level at ground potential, and potential at the upper electrode 22 at an intermediate potential (so-called "½ potential") between the source potential and ground potential.

Now, a method of manufacturing the semiconductor memory according to the present embodiment is described. FIGS. 4A-4C, 5A-5C, 6A-6C, 7A-7C, 8A-8C, 9A-9C and 10A-10C are process drawings showing the method. FIGS. 4A, 5A, 6A, 7A, 8A, 9A and 10A correspond to the section of the DRAM cells shown in FIG. 3A. FIGS. 4B, 5B, 6B, 7B, 8B, 9B and 10B correspond to the section shown in FIG. 3B. FIGS. 4C, 5C, 6C, 7C, 8C, 9C and 10C correspond to the section of the peripheral transistors shown in FIG. 3C.

Figure 4A:
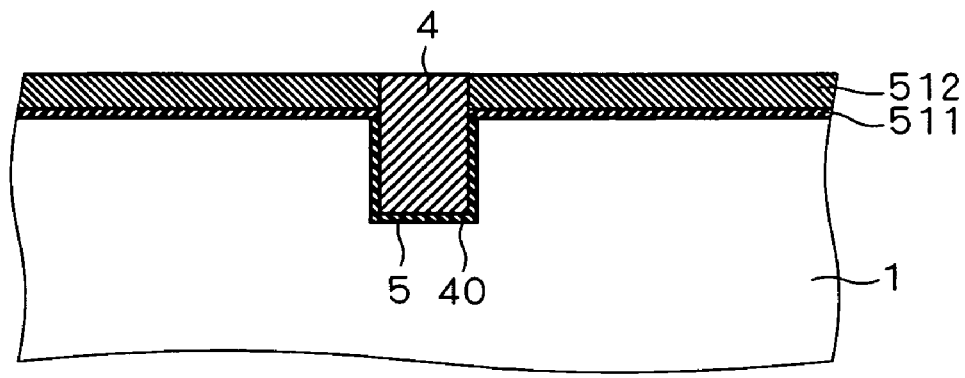
Figure 4B:
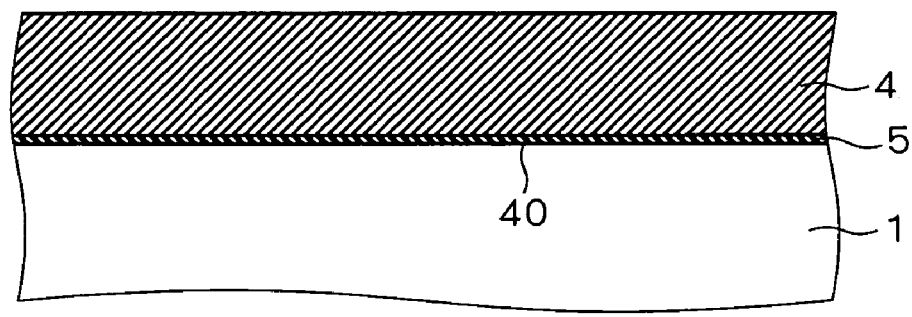
Figure 4C:
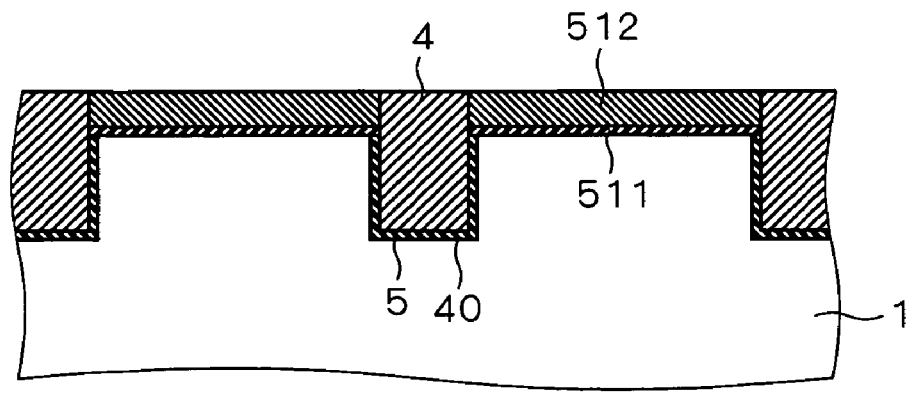

First, the upper surface of the silicon substrate 1 is subjected to thermal oxidation to form an oxide film 511. Next, a silicon nitride film is formed thereon, and an opening is created therein with the pattern of the isolation trench 40 to form a first mask pattern 512. The oxide film 511 and the upper portion of the silicon substrate 1 are then subjected to etching using the first mask pattern 512 as a mask to form isolation trenches 40 in the DRAM cell area and peripheral circuit area, respectively. Since the isolation trench 40 in the DRAM cell area and the isolation trench 40 in the peripheral circuit area are formed concurrently, and therefore have almost the same depth. Thereafter, the oxide film 5 is formed on the inside of the isolation trenches 40 by thermal oxidation, and the isolation trenches 40 are filled with a high density plasma oxide film. An excessive part of the high density plasma oxide film is removed by CMP, so that the isolation insulation film 4 is formed in the isolation trenches 40 (FIGS. 4A-4C).

Figure 5A:
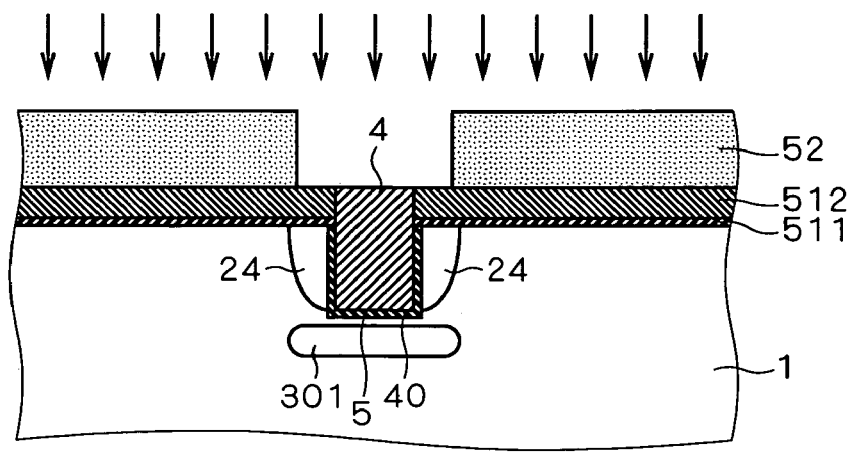
Figure 5B:
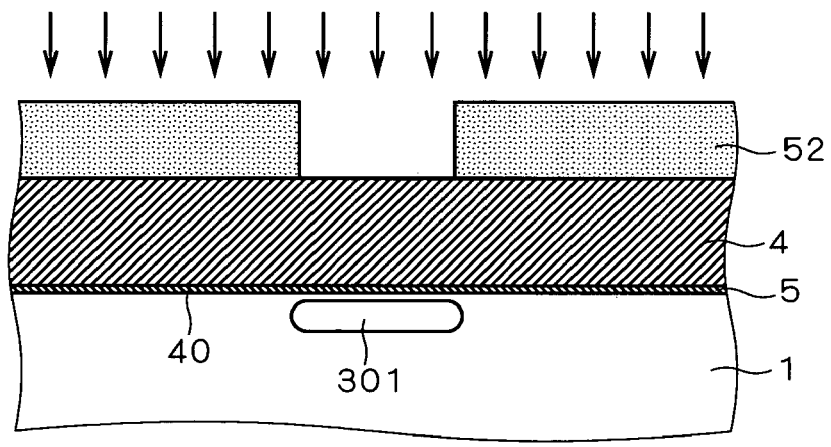
Figure 5C:
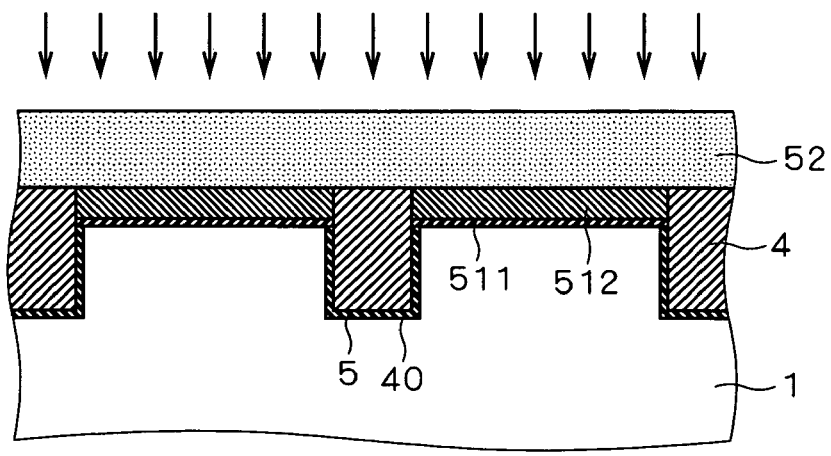

Then, without removing the first mask pattern 512, a second mask pattern 52 (photoresist) provided with an opening with the pattern of the opening 41 is formed as shown in FIGS. 5A-5C. N-type ions are implanted using the second mask pattern 52 as a mask to form the first channel cut layer 301 at a depth in the vicinity of the bottom of the isolation trench 40, for example, at about the same degree of dose as a general channel cut layer (e.g., about $10^{13}/cm^2$).

Subsequently, P-type ions are implanted also using the second mask pattern 52 as a mask to form the lower diffusion layer 24. At this time, implantation is made within a range from the vicinity of the upper surface of the silicon substrate 1 to a depth not reaching the bottom of the isolation trench 40, at a high dose of about $10^{20}/cm^3$ ($10^{15}/cm^2$). In the sectional view shown in FIG. 5A, the opening of the second mask pattern 52 is greater than the isolation trench 40 in width, and therefore, P-type ions are implanted into the inner walls of the isolation trench 40 exposed by the opening 41. As a result, the lower diffusion layer 24 is generated on the inner walls of the isolation trench 40.

Figure 6A:
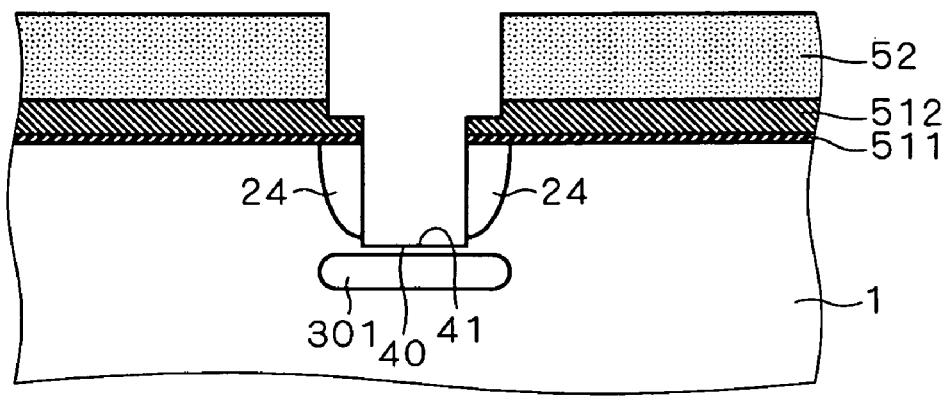
Figure 6B:
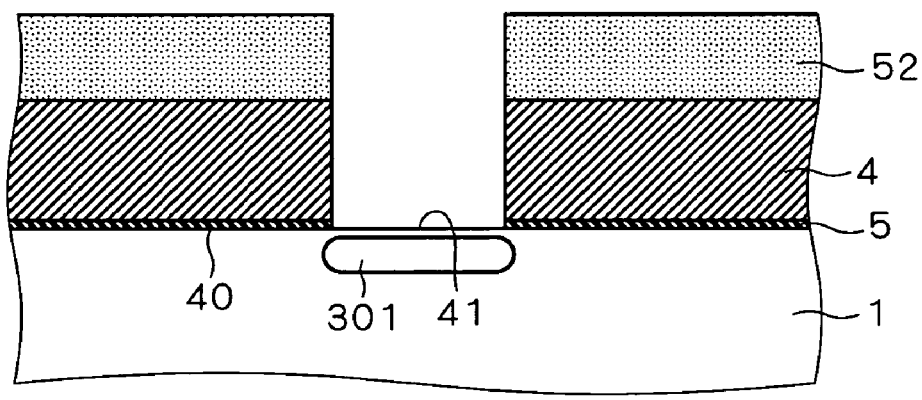
Figure 6C:
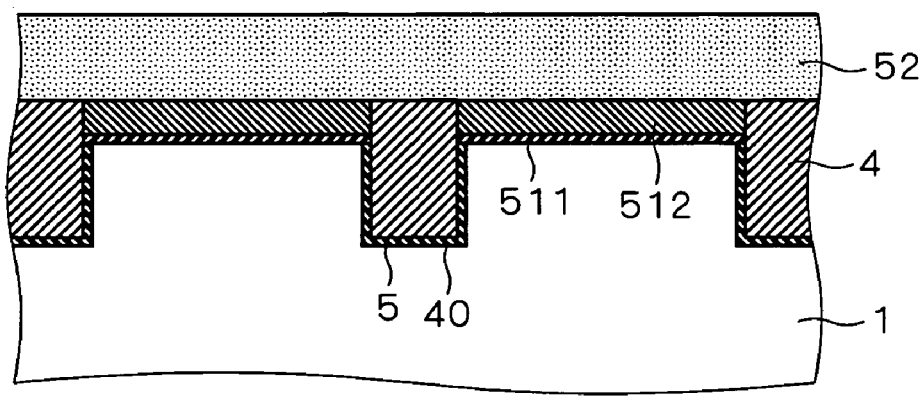

Then, dry etching is conducted using the first and second mask patterns 512 and 52 as a mask to remove the isolation insulation film 4 and oxide film 5, so that the opening 41 is formed (FIGS. 6A-6C). This etching is conducted such that the opening 41 reaches the bottom of the isolation trench 40. Accordingly, the opening 41 by which the inner walls and bottom of the isolation trench 40 are exposed is formed in the isolation insulation film 4. In the sectional view shown in FIG. 6A, the second mask pattern 52 is greater than the isolation trench 40 in width, however, the upper surface of the silicon substrate 1 is not etched because it is covered by the first mask pattern 512. This can prevent the upper portion of the opening 41 from being unnecessarily etched and damaged.

When the first mask pattern 512 is made of a nitride film, an etch selectivity of about 5 of the high density plasma oxide film to the isolation insulation film 4 can be ensured in usual anisotropic dry etching. Letting the isolation insulation film 4 have a thickness of about 250 nm, for example, the first mask pattern 512 is etched by 50 nm in this step. Hence, the first mask pattern 512 preferably has a thickness of about 100 nm. In the present embodiment, the first mask pattern 512 is made of a silicon nitride film, however, any other material that can provide an etch selectivity to the isolation insulation film 4 may be used instead.

Figure 7A:
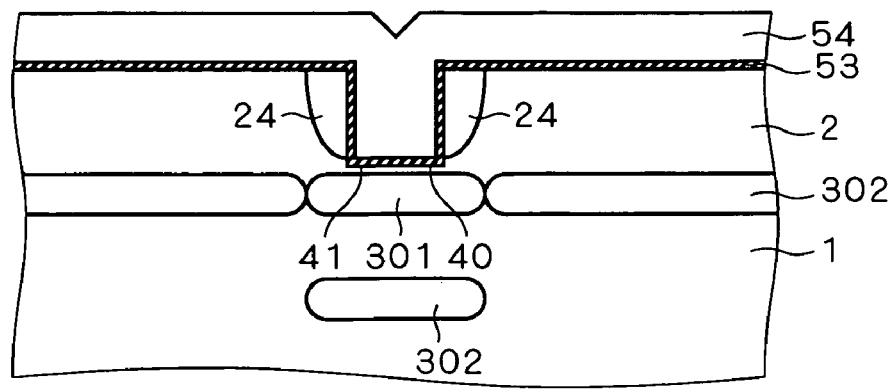
Figure 7B:
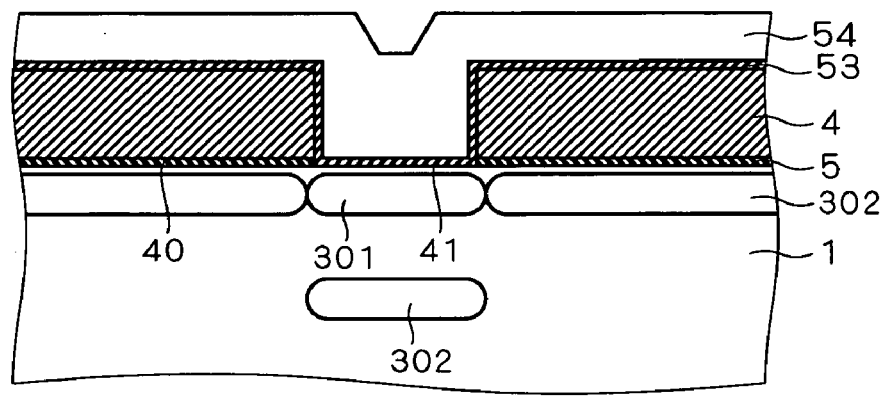

After removing the first mask pattern 512, second mask pattern 52 and oxide film 511 and forming a sacrificial oxide film (not shown) on the surface of the silicon substrate 1, a third mask pattern (not shown) provided with an opening in a region where the N well 2 is to be formed using a photoresist is formed, and ion implantation is carried out using the third mask pattern as a mask to form the N well 2 and second channel cut layer 302. In this step, implantation for forming the second channel cut layer 302 is made to a depth in the vicinity of the bottom of the isolation trench 40, similarly to the first channel cut layer 301. In the region where the opening 41 is formed, however, the second channel cut layer 302 is formed locally in a deep position (away from the bottom of the opening 41) as shown in FIGS. 7A and 7B due to the difference in level between the upper surface of the silicon substrate 1 and the bottom of the opening 41. As a result, the channel cut layer structure locally has the two-level structure under the opening 41 made up of the first and second channel cut layers 301 and 302.

Figure 7C:
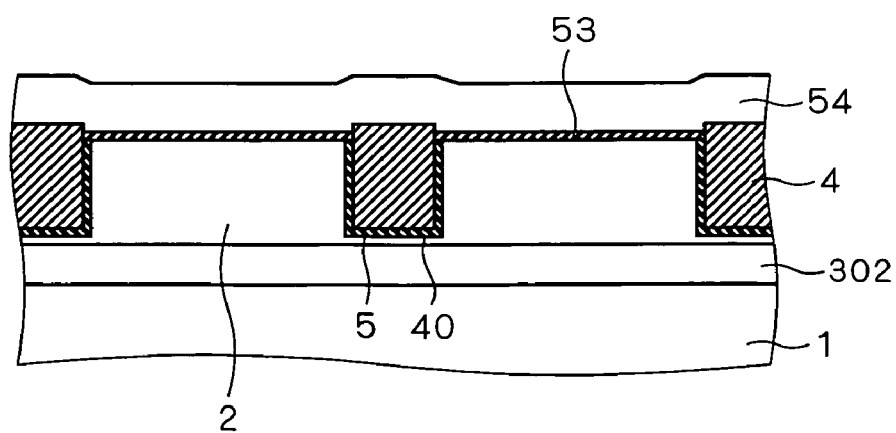

Then, channel doping is carried out for adjusting threshold values of the PMOS transistors T1, T2 and peripheral transistors and the sacrificial oxide film is removed, and then, an oxide film 53 and a polysilicon film 54 are formed directly on the surface of the silicon substrate 1 as shown in FIGS. 7A-7C. In the present embodiment, since both the inner walls and bottom of the isolation trench 40 are exposed by the opening 41, the oxide film 53 is formed in almost equal thickness on the surface of the silicon substrate 1 and the inner walls and bottom of the isolation trench 40.

Figure 8A:
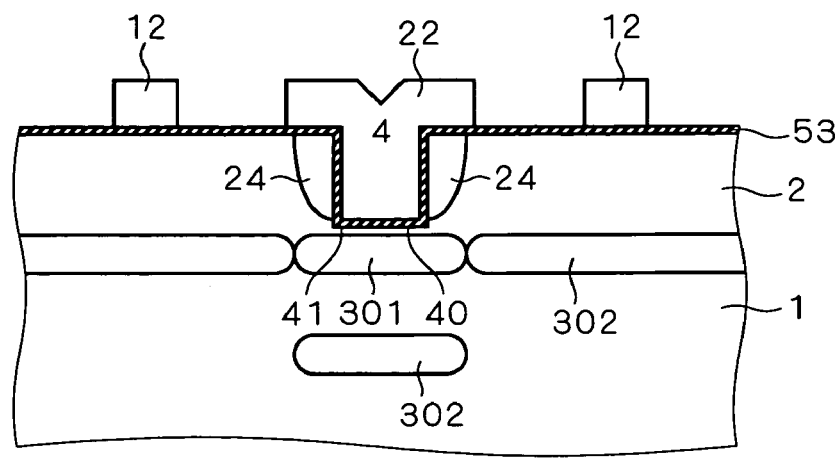
Figure 8B:
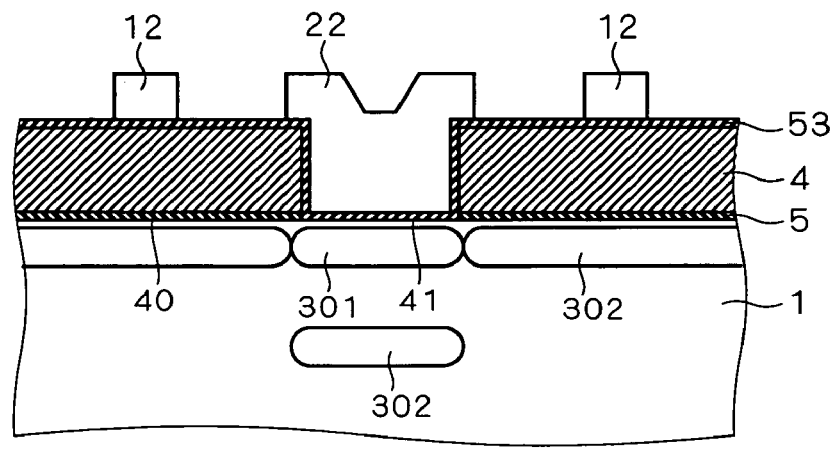
Figure 8C:
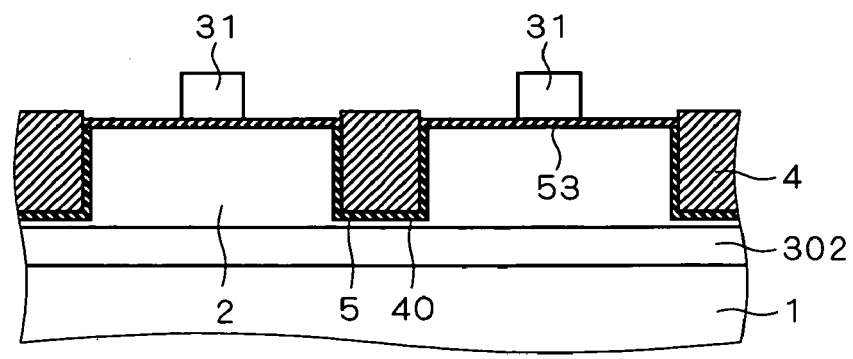

Thereafter, a resist mask with an electrode pattern is formed on the polysilicon film 54, and etching is conducted using the resist mask as a mask to pattern the polysilicon film 54. The gate electrodes 12, upper electrode 22 and gate electrodes 31 of the peripheral transistors are thereby formed (FIGS. 8A-8C).

Then, ion implantation is carried out using the gate electrodes 12, upper electrode 22 and gate electrodes 31 of the peripheral transistors as a mask to form an LDD layer for the PMOS transistors T1, T2 and peripheral transistors. Thereafter, a silicon nitride film is deposited on the entire surface and is etched back to form the sidewalls 13, 23 and 34 on the side surfaces of the gate electrodes 12, upper electrode 22 and gate electrodes 31 of the peripheral transistors, respectively. Concurrently, the oxide film 53 is also patterned to form the gate oxide film 11 of the PMOS transistors T1, T2, dielectric layer 21 of the capacitors C, C2 and gate oxide film 33 of the peripheral transistors. As described above, the oxide film 53, formed in almost equal thickness on the surface of the silicon substrate 1, inner walls and bottom of the isolation trench 40 exposed by the opening 41, the dielectric layer 21 is in almost constant thickness on the inner walls and bottom of the isolation trench 40, and the gate oxide film 11 for the PMOS transistors T1, T2 and gate oxide film 33 for the peripheral circuit are also formed in almost the same thickness.

Figure 9A:
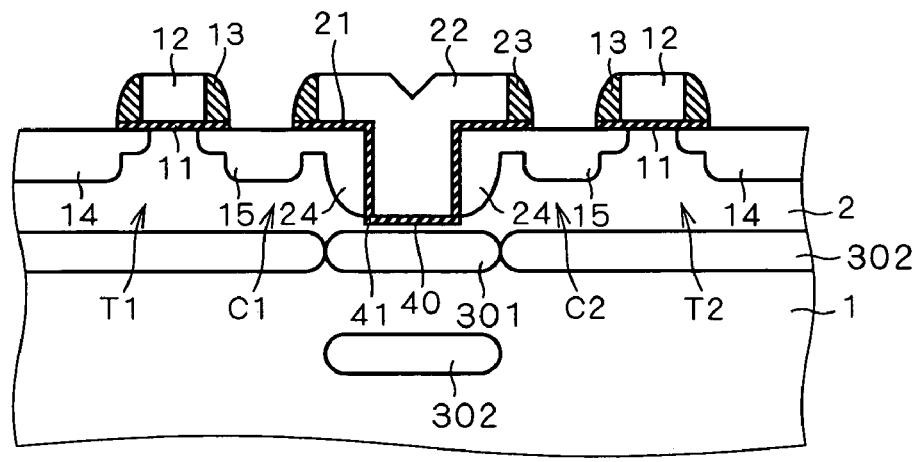
Figure 9B:
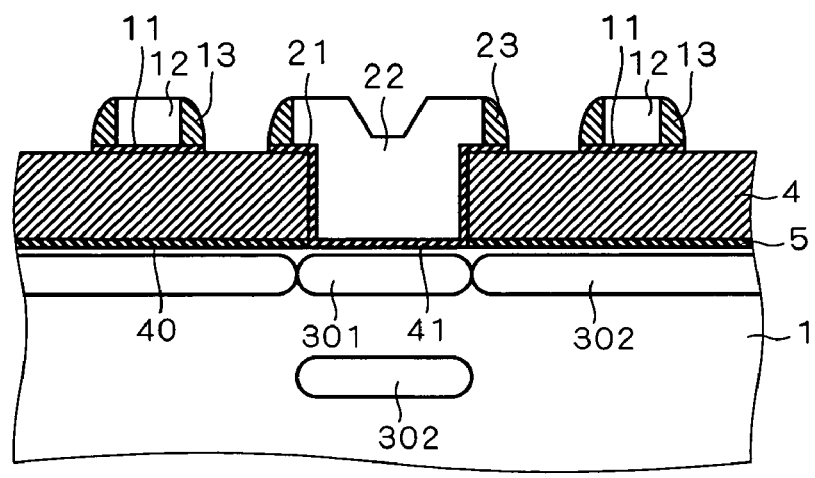
Figure 9C:
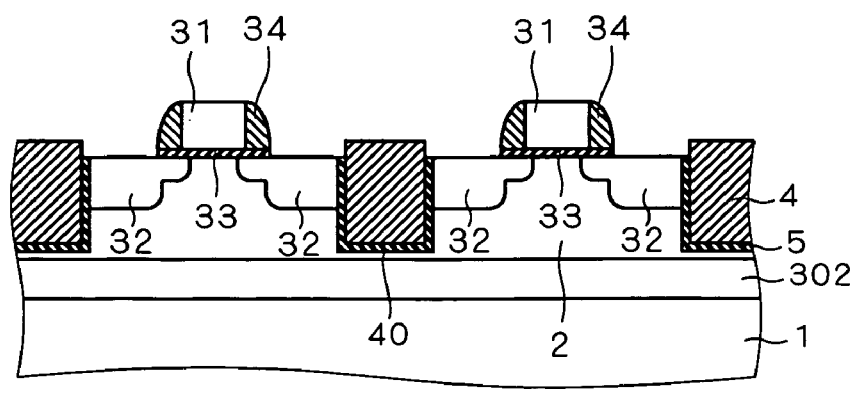
Figure 10A:
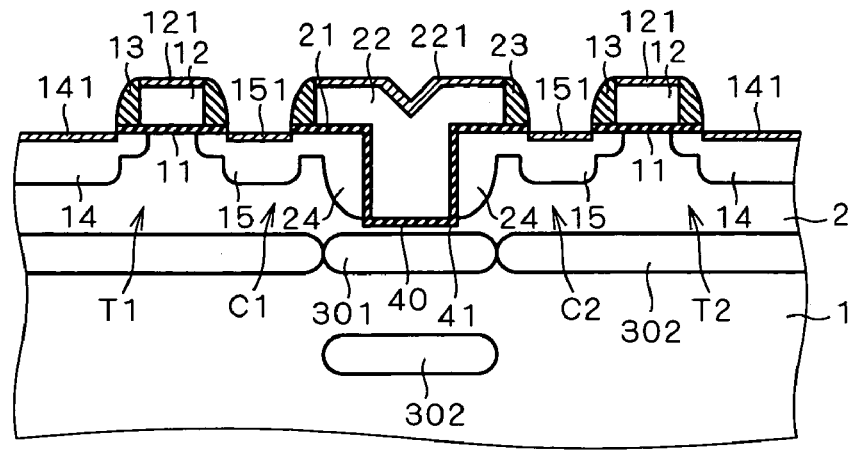
Figure 10B:
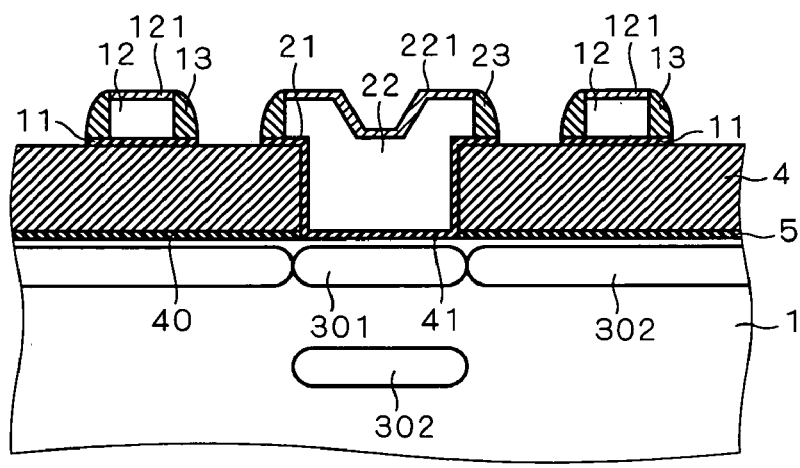
Figure 10C:
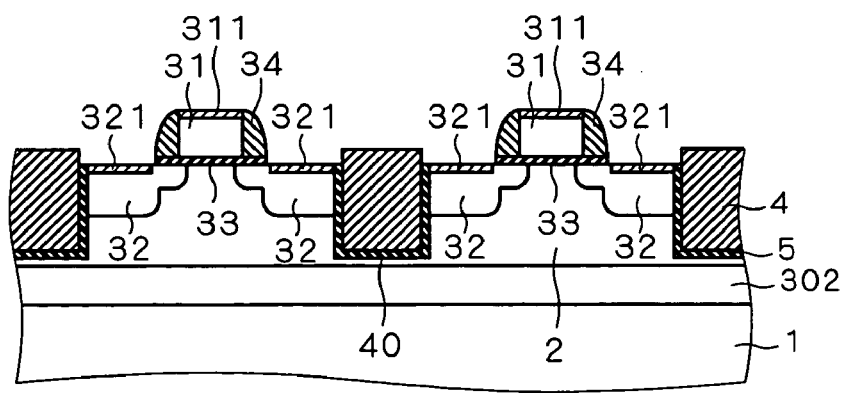

Further, ion implantation is carried out to form the source/drain regions 14, 15 for the PMOS transistors T1, T2 and source/drain regions 32 for the peripheral transistors (FIGS. 9A-9C). Thereafter, a metal film made of cobalt, for example, is formed on the entire surface of a region in which silicide layers are to be formed, and is subjected to heat treatment to remove an unreacted portion of the metal film. The silicide layers 121, 141, 151, 221, 311 and 321 are thereby formed in a self-aligned manner in the DRAM cell area and peripheral circuit area (FIGS. 10A-10C).

An interlayer insulation film 6 is then deposited, and the contacts 16 and 35 are formed therein. The bit line BL and interconnect lines 37 are formed on the interlayer insulation film 6, so that the semiconductor memory shown in FIGS. 3A-3C is obtained.

As described above, the method according to the present embodiment is implemented by carrying out ion implantation for the first channel cut layer 301 independently from ion implantation for the second channel cut layer 302 so as to form the channel cut layer 301 in the vicinity of the bottom of the opening 41. The number of ion implantation is hence larger than in the conventional manufacturing method by one, however, there is no more increase in the number of steps, which is kept at minimum.

For instance, when the channel cut layers shall be formed just after the step shown in FIGS. 4A-4C (i.e., prior to forming the second mask pattern 52), the channel cut layers can be formed by ion implantation at one time in a band in the vicinity of the bottom of the isolation trench 40 because the upper surface of the silicon substrate 1 (i.e., upper surfaces of the isolation insulation film 4 and first mask pattern 512) is flat. However, a P well region in which NMOS transistors for the peripheral circuit and the like are to be formed is usually formed in the silicon substrate 1 in addition to the N well region, and therefore, channel cut layers need to be formed individually for the N and P well regions, respectively. That is, in the case of forming the channel cut layers just after the step shown in FIGS. 4A-4C, another resist mask patterned with an opening for the N or P well region needs to be formed at that time, arising the need for photoresist coating, mask alignment and exposure, which contrarily complicates manufacturing steps.

By the method according to the present embodiment, the first channel cut layer 301 can be formed using the first mask pattern 512 for forming the opening 41 and lower diffusion layer 24, and the second channel cut layer 302 can be formed using the third mask pattern (not shown) for forming the N well 2. This allows the channel cut layers to locally have the two-level structure under the opening 41. In this manner, the manufacturing steps according to the present embodiment allows the DRAM cells of the present invention to be formed relatively easily.

As understood from the foregoing description, the method according to the present embodiment allows concurrent generation of the peripheral transistors, similarly to the conventional method. That is, the DRAM cells according to the present embodiment can easily be applied to the conventional semiconductor memory without any adverse influence on the peripheral circuit. Further, the dielectric layer 21 for the capacitors C1 and C2 can be formed in the same step of forming the gate oxide film 11 for the PMOS transistors T1, T2 and the gate oxide film 33 for the peripheral transistors, which can advantageously reduce the number of manufacturing steps and simplify the manufacturing method.

For ease of description, the present embodiment has only shown peripheral transistors having a gate oxide film (gate oxide film 33) in the same thickness as a gate oxide film (gate oxide film 11) for transistors of the DRAM cells, however, the present invention is also applicable to a semiconductor device having, in a peripheral circuit, a plurality of transistors whose gate oxide films differ from one another in thickness and breakdown voltage characteristics.

Second Preferred Embodiment

Figure 11A:
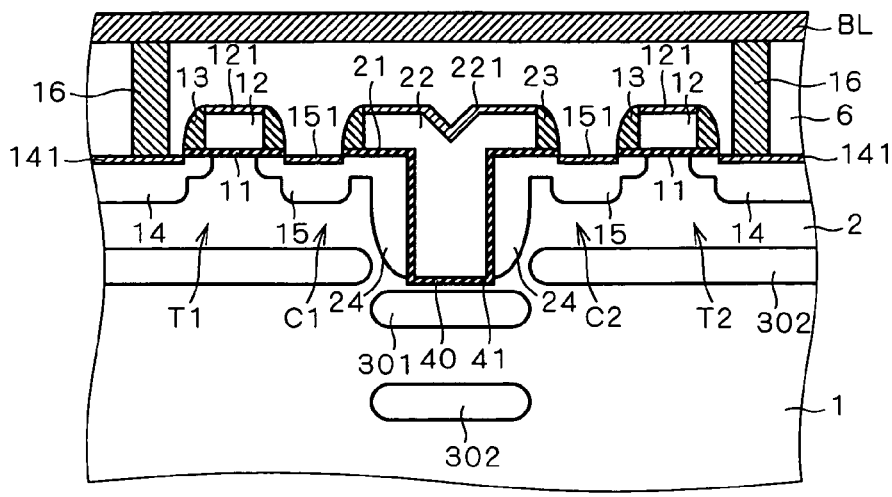
FIGS. 11A-11C are sectional views showing a DRAM cell provided for a semiconductor memory according to a second preferred embodiment of the invention.
Figure 11B:
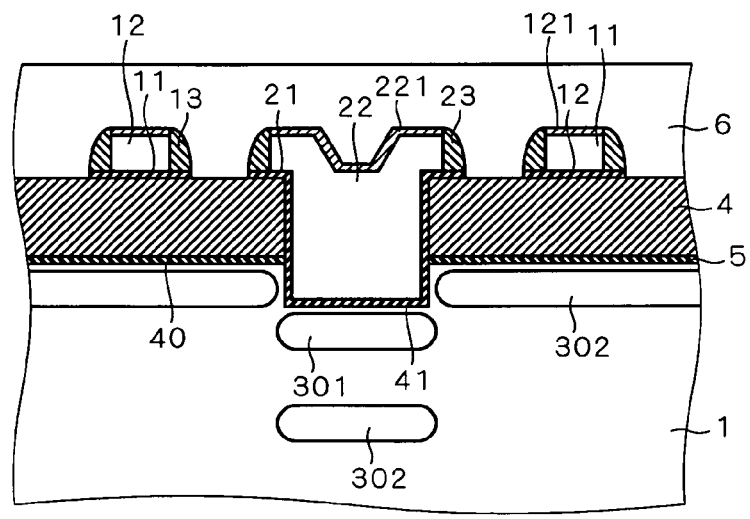
Figure 11C:
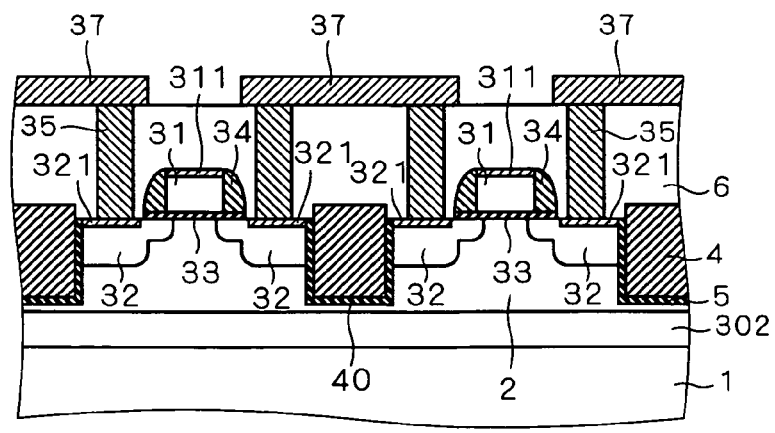

FIGS. 11A to 11C are sectional views showing the structure of a semiconductor memory according to a second preferred embodiment. FIGS. 11A and 11B are sectional views taken along the lines A-A and B-B, respectively, in the DRAM cell array structure shown in FIG. 2, and FIG. 11C is a sectional view of peripheral transistors. In FIGS. 11A-11C, like elements having similar functions as those shown in FIG. 3 are indicated by the same reference characters, and redundant explanation is omitted here.

The isolation trench 40 has a constant depth in the first preferred embodiment. In the semiconductor memory according to the present embodiment, however, the isolation trench 40 is locally formed deeply in the region where the opening 41 is formed, as shown in FIGS. 11A and 11B. In other words, the opening 41 by which the inner walls and bottom of the isolation trench 40 are exposed is formed more deeply than in the first preferred embodiment. The rest of the structure is similar to that described in the first preferred embodiment.

According to the present embodiment, forming the opening 41 deeply increases the area of the inner walls of the isolation trench 40, which contributes to the effective area of the capacitors C1 and C2. This increases the capacity of the capacitors C1 and C2 as compared to the first preferred embodiment.

In the present embodiment, the channel cut layer 301 (first channel cut layer) is also formed in the vicinity of the bottom of the opening 41 etched down deeply, which prevents a parasitic MOS transistor from being formed under the opening 41. Accordingly, as shown in FIG. 11A, charge leakage between cells can be suppressed even with the capacitors C1 and C2 extending into the opening 41 which reaches the bottom of the isolation trench 40. That is, the effective area of the capacitors C1 and C2 can be larger than in the first preferred embodiment, while suppressing charge leakage between memory cells.

In the present embodiment, in the case where the first channel cut layer 301 is not enough to prevent the generation of a parasitic MOS transistor, the upper electrode 22 needs to be always kept at a positive potential during operation of the semiconductor memory. Accordingly, the parasitic MOS transistor generated between the capacitors C1 and C2 is therefore difficult to turn on, which can prevent charge leakage.

As understood from FIGS. 11A and 11B, the channel cut layer structure according to the present embodiment locally has a two-level structure under the opening 41 made up of the first channel cut layer 301 and the second channel cut layer 302.

Now, a method of manufacturing the semiconductor memory according to the present embodiment is described. FIGS. 12A-12C, 13A-13C, 14A-14C, 15A-15C, 16A-16C, 17A-17C, 18A-18C and 19A-19C are process drawings showing the method. FIGS. 12A, 13A, 14A, 15A, 16A, 17A, 18A and 19A correspond to the section of the DRAM cells shown in FIG. 11A. FIGS. 12B, 13B, 14B, 15B, 16B, 17B, 18B and 19B correspond to the section shown in FIG. 11B. FIGS. 12C, 13C, 14C, 15C, 16C, 17C, 18C and 19C correspond to the section of the peripheral transistors shown in FIG. 11C.

Figure 12A:
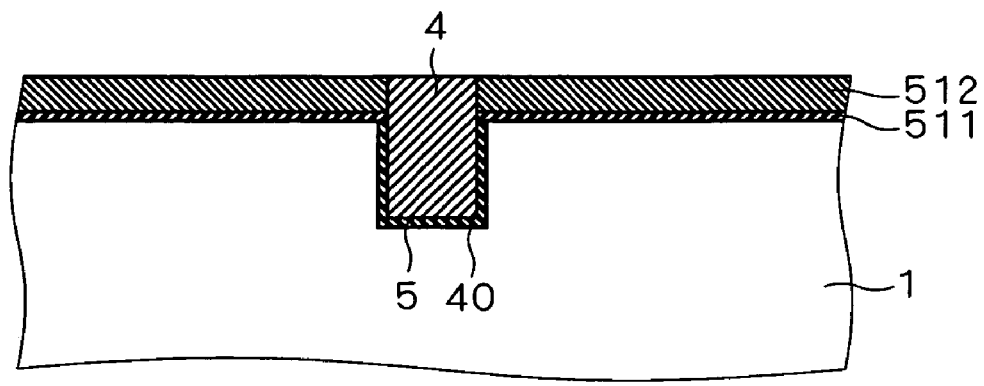
FIGS. 12A-12C, 13A-13C, 14A-14C, 15A-15C, 16A-16C, 17A-17C, 18A-18C and 19A-19C are process drawings showing a method of manufacturing the DRAM cell according to the second preferred embodiment.
Figure 12B:
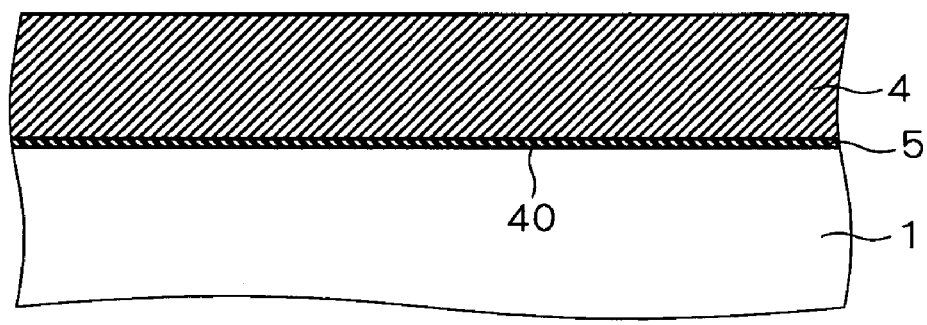
Figure 12C:
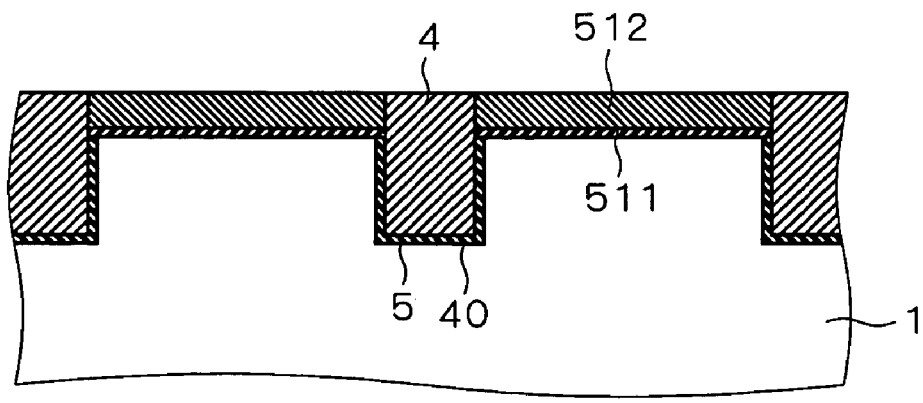

First, similarly to the first preferred embodiment, the oxide film 511 and first mask pattern 512 having an opening with the pattern of the isolation trench 40 are formed on the upper surface of the silicon substrate 1. The oxide film 511 and the upper portion of the silicon substrate 1 are then subjected to etching using the first mask pattern 512 as a mask to form isolation trenches 40 in the DRAM cell area and peripheral circuit area, respectively. Since the isolation trench 40 in the DRAM cell area and the isolation trench 40 in the peripheral circuit area are formed concurrently, and therefore have almost the same depth. Thereafter, the oxide film 5 is formed on the inside of the isolation trench 40 by thermal oxidation, and the isolation trench 40 is filled with a high density plasma oxide film. An excessive part of the high density plasma oxide film is removed by CMP, so that the isolation insulation film 4 is formed in the isolation trench 40 (FIGS. 12A-12C).

Figure 13A:
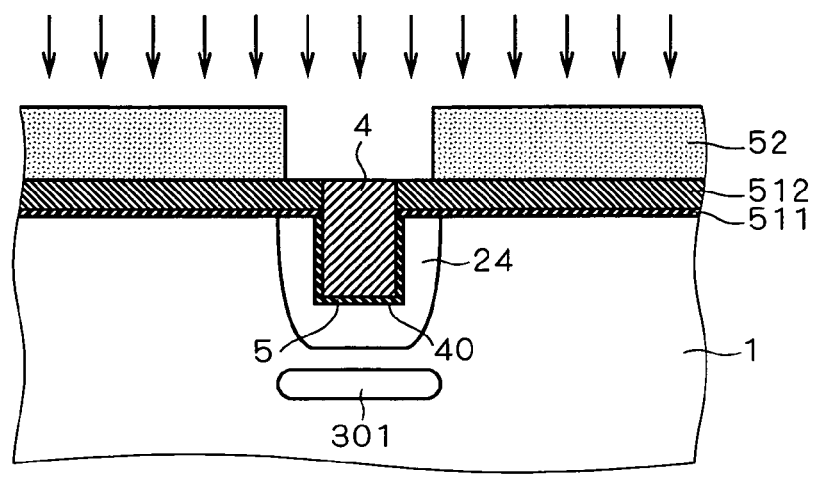
Figure 13B:
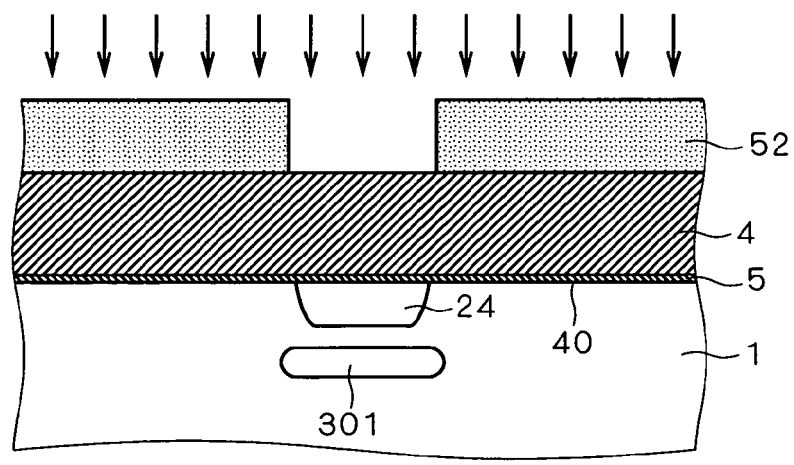
Figure 13C:
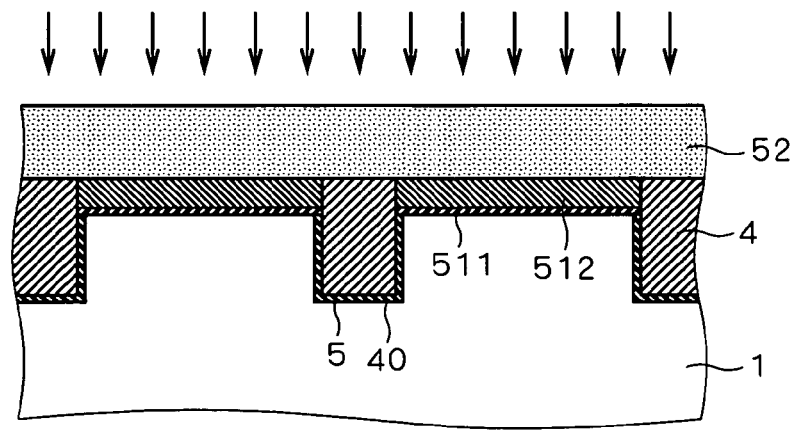

Then, without removing the first mask pattern 512, a second mask pattern 52 having an opening with the pattern of the opening 41 is formed as shown in FIGS. 13A-13C. N-type ions are implanted using the second mask pattern 52 as a mask to form the first channel cut layer 301, for example, at about the same degree of dose as a general channel cut layer (e.g., about $10^{13}/cm^2$). In the present embodiment, as described earlier, the opening 41 to be formed thereafter is made deeper than in the first preferred embodiment, however, in this step, the depth of implantation of N type ions is determined such that the first channel cut layer 301 is formed in the vicinity of the final depth of the opening 41 (see FIGS. 11A and 11B). That is, the first channel cut layer 301 is formed more deeply than the bottom of the isolation trench 40 at this stage, as shown in FIG. 13A.

Subsequently, P-type ions are implanted also using the second mask pattern 52 as a mask to form the lower diffusion layer 24. At this time, implantation is made within a range from the vicinity of the upper surface of the silicon substrate 1 to a depth not reaching the final depth of the opening 41 (see FIG. 11A), at a high dose of about $10^{20}/cm^3$ ($10^{15}/cm^2$). At this stage, the lower diffusion layer 24 is generated on the inner walls and bottom of the isolation trench 40.

Figure 14A:
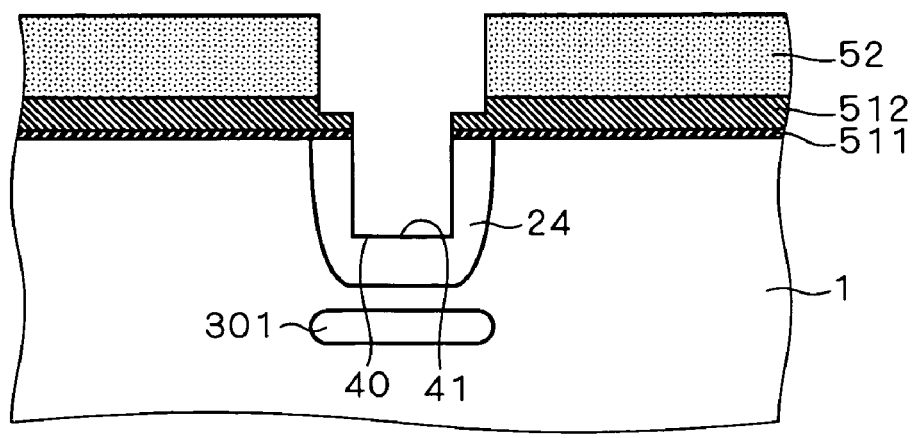
Figure 14B:
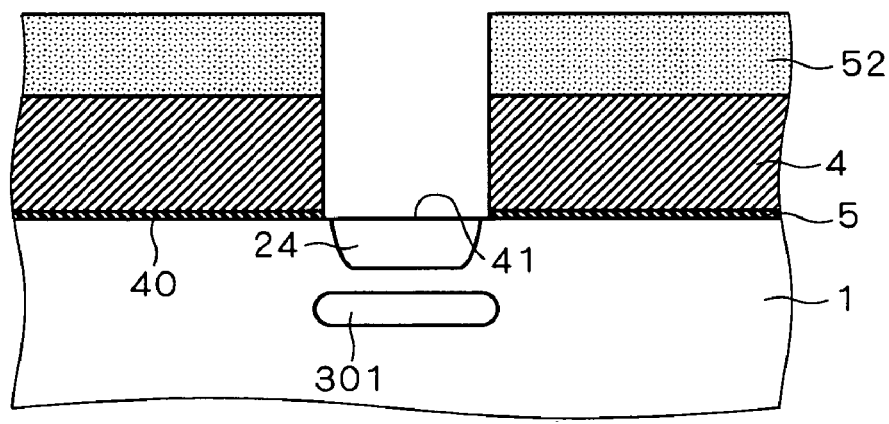
Figure 14C:
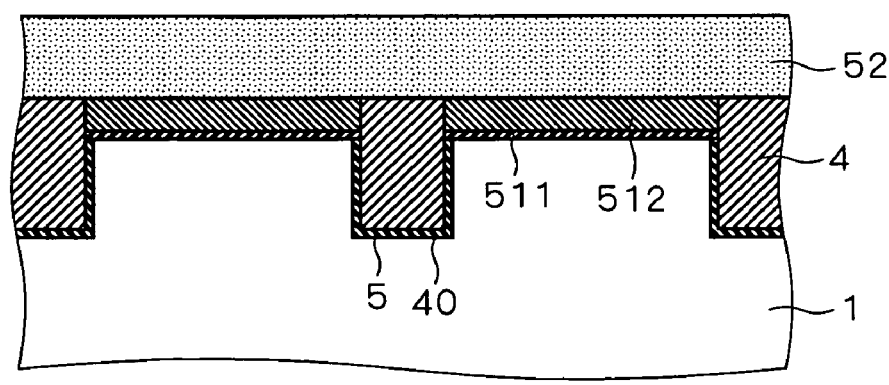

Then, the isolation insulation film 4 and oxide film 5 are removed by dry etching using the first and second mask patterns 512 and 52 as a mask to form the opening 41 by which the inner walls and bottom of the isolation trench 40 are exposed (FIGS. 14A-14C).

Figure 15A:
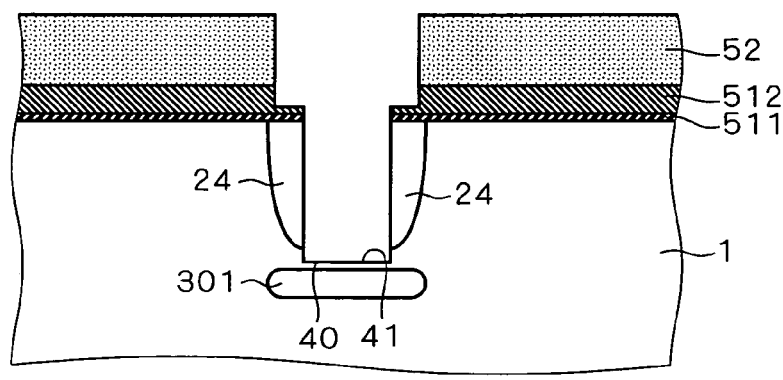
Figure 15B:
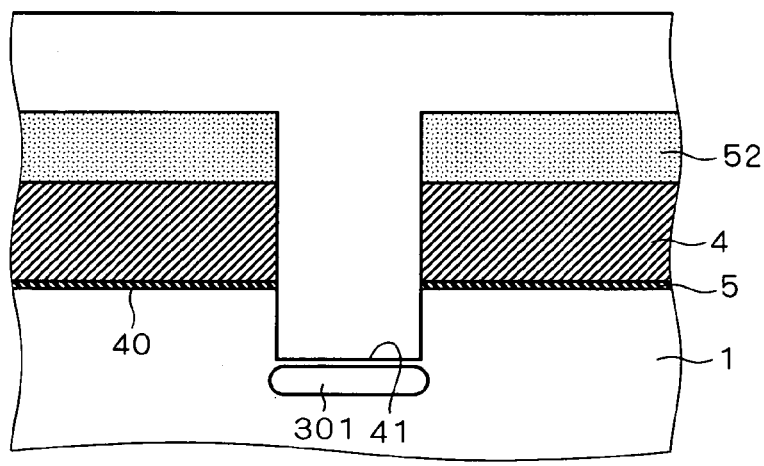
Figure 15C:
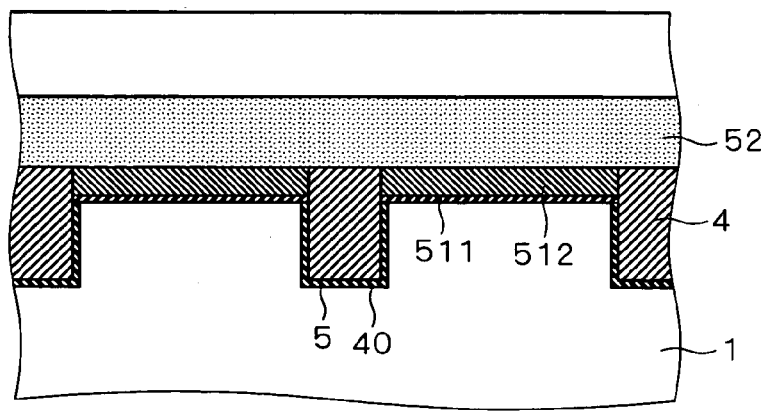

Dry etching is further conducted using the first and second mask patterns 512 and 52 as a mask to further etch down the bottom of the opening 41 (i.e., the bottom of the isolation trench 40) (FIGS. 15A and 15B). An isolation trench 40 in the region where the opening 41 is formed is thereby made deeper than in isolation trenches 40 in the other region (including the DRAM cell area and peripheral circuit area). Further, as a result, part of the lower diffusion layer 24 formed on the bottom of the opening 41 is removed, and the first channel cut layer 301 is located in the vicinity of the bottom of the opening 41 having been etched further.

In the sectional views shown in FIGS. 14A and 15A, the opening width of the second mask pattern 52 is greater than that of the isolation trench 40, however, the upper surface of the silicon substrate 1 is not etched because the first mask pattern 512 remains thereon. This prevents the upper portion of the opening 41 from being unnecessarily etched and damaged.

Subsequent steps are similar to those described in the first preferred embodiment with reference to FIGS. 7A through 10C. More specifically, the first mask pattern 512, second mask pattern 52 and oxide film 511 are removed, and a sacrificial oxide film (not shown) is formed on the surface of the silicon substrate 1. Thereafter, a third mask pattern (not shown) having an opening in the region where the N well 2 is to be formed using a photoresist is formed, and ion implantation is carried out using the third mask pattern as a mask to form the N well 2 and second channel cut layer 302 as well as to carry out channel doping. In this step, ion implantation for forming the second channel cut layer 302 is made to a depth in the vicinity of the bottom of the isolation trench 40. In the region where the opening 41 is formed, however, the two-level channel cut structure made up of the first and second channel cut layers 301 and 302 under the opening 41 as shown in FIGS. 16A and 16B due to the difference in level between the upper surface of the silicon substrate 1 and the bottom of the opening 41.

Figure 16A:
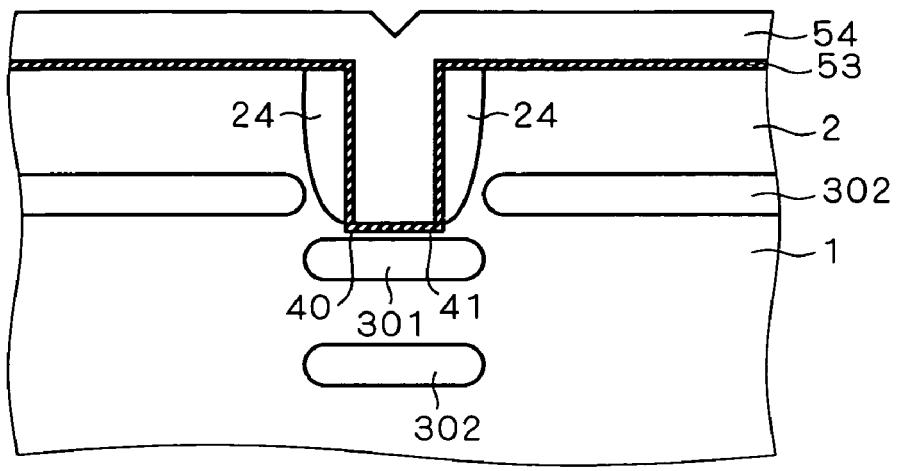
Figure 16B:
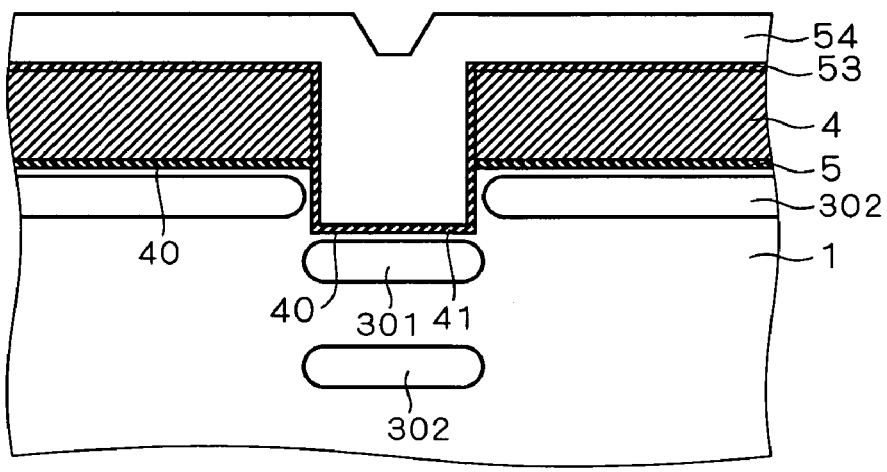
Figure 16C:
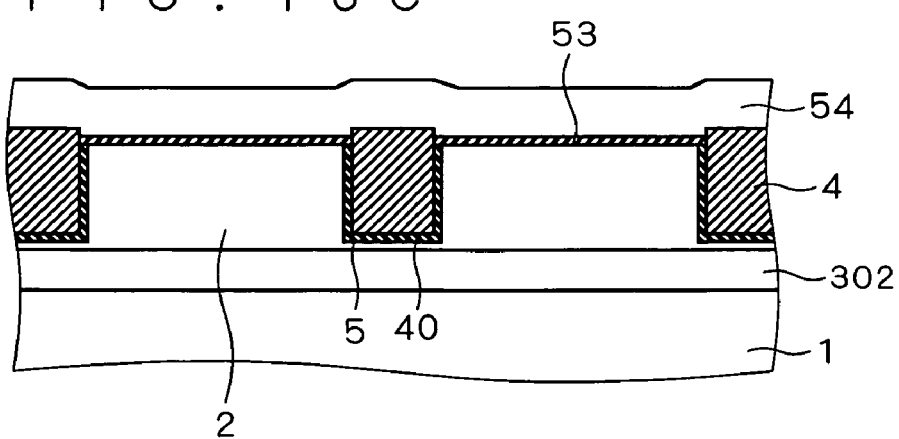
Figure 17A:
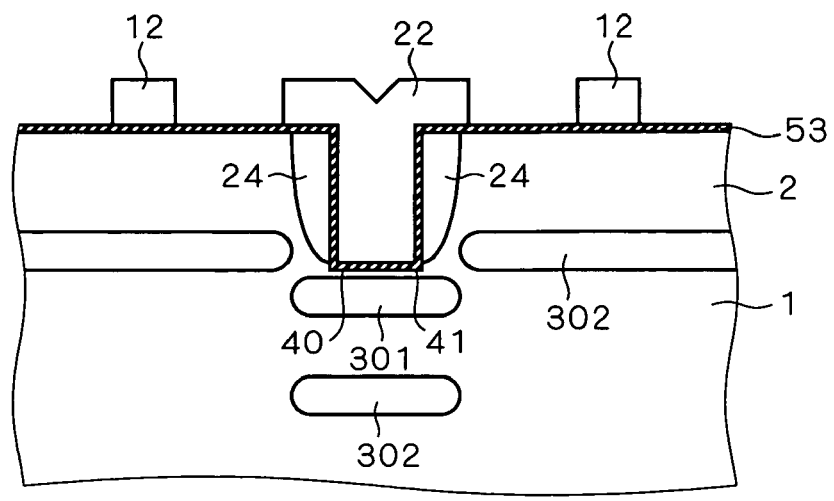
Figure 17B:
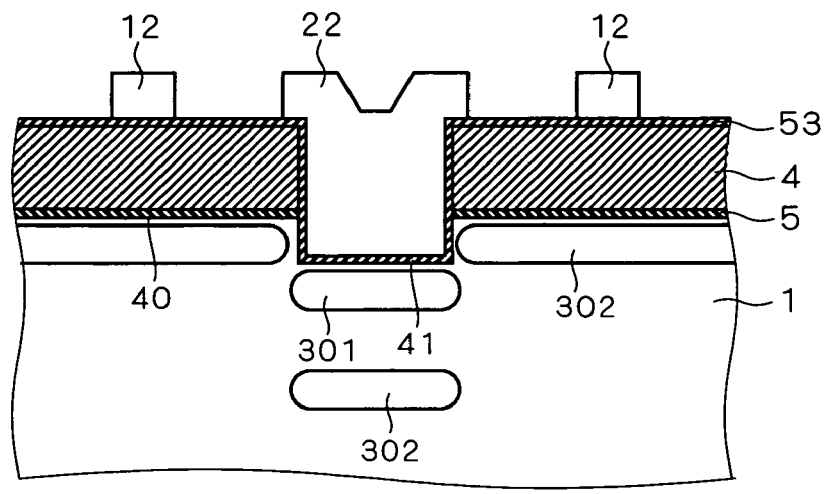
Figure 17C:
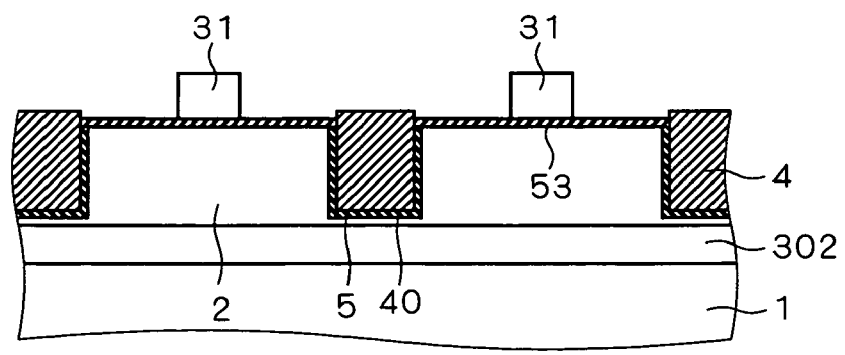

Then, the oxide film 53 and a polysilicon film 54 are formed on the surface of the silicon substrate 1 (FIGS. 16A-16C). In the present embodiment, both the inner walls and bottom of the isolation trench 40 are also exposed by the opening 41 having been etched down deeply. Accordingly, the oxide film 53 is formed in almost equal thickness on the surface of the silicon substrate 1 and the inner walls and bottom of the isolation trench 40.

Thereafter, the polysilicon film 54 is patterned to form the gate electrodes 12, upper electrode 22 and gate electrodes 31 for the peripheral transistors (FIGS. 17A-17C), and an LDD layer for the PMOS transistors T1, T2 and the peripheral transistors is formed by ion implantation. Further, the sidewalls 13, 23 and 34 are formed on the side surfaces of the gate electrodes 12, upper electrode 22 and gate electrodes 31 for the peripheral transistors, respectively, and the gate oxide films 11, 33 and dielectric layer 21 are formed.

As already described, since the oxide film 53 is formed in almost equal thickness on the surface of the silicon substrate 1 and the inner walls and bottom of the isolation trench 40 exposed by the opening 41, the dielectric layer 21 has almost equal thickness on the inner walls and bottom of the isolation trench 40, almost the same as the gate oxide film 11 for the PMOS transistors T1, T2 and gate oxide film 33 for the peripheral circuit.

Figure 18A:
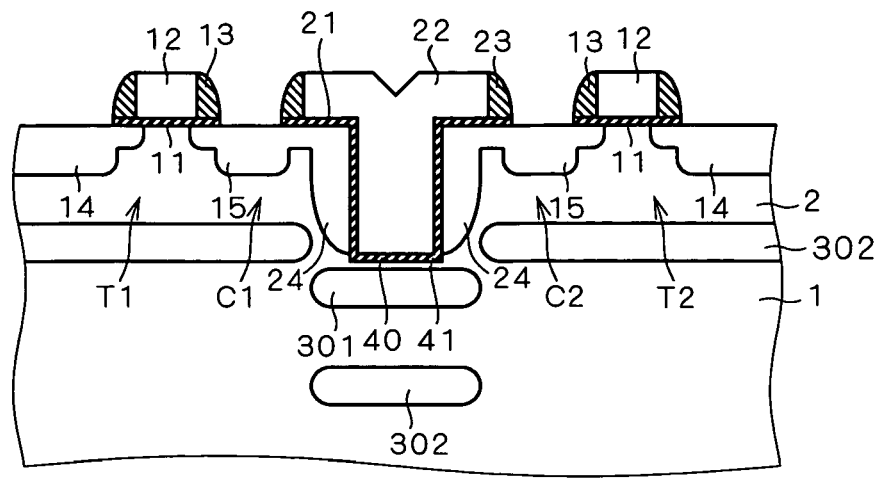
Figure 18B:
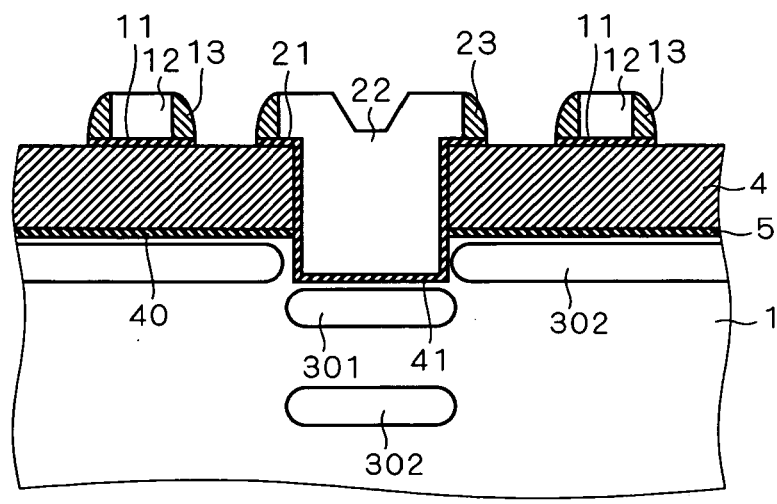
Figure 18C:
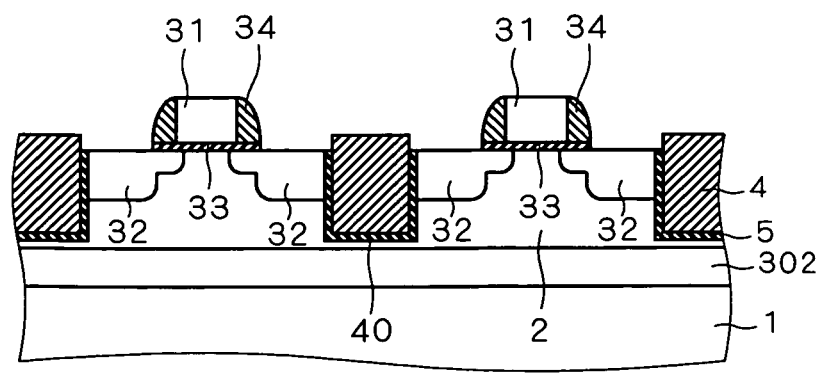
Figure 19A:
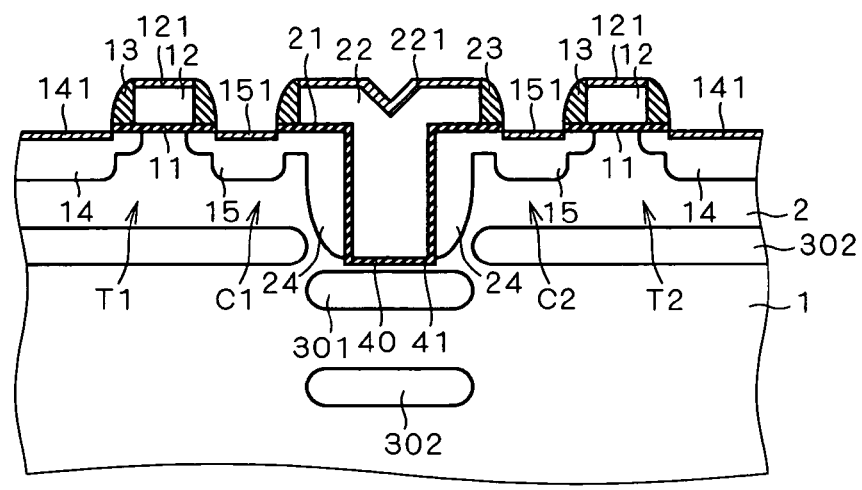
Figure 19B:
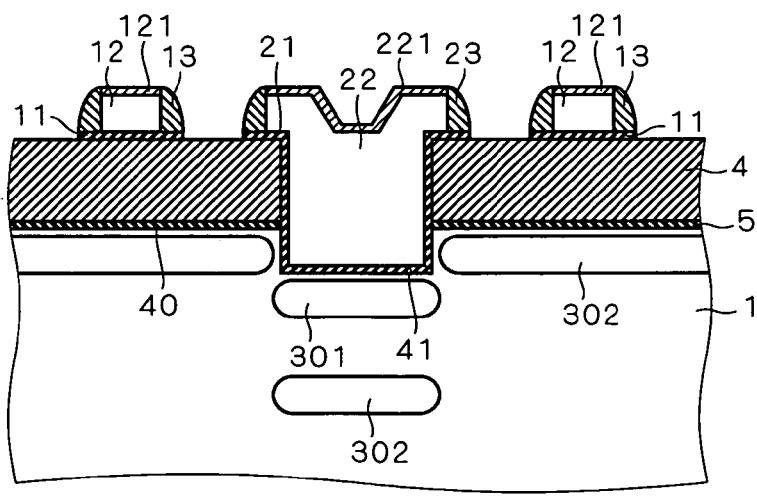
Figure 19C:
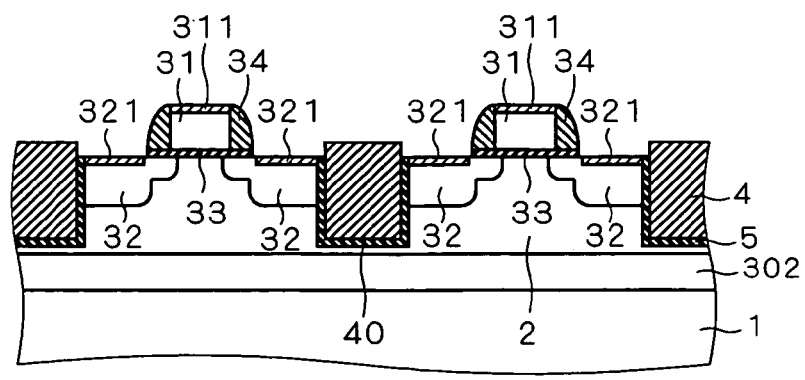

The source/drain regions 14, 15 for the PMOS transistors T1, T2 and source/drain regions 32 for the peripheral transistors are formed by ion implantation (FIGS. 18A-18C). Thereafter, the silicide layers 121, 141, 151, 221, 311 and 321 are formed in a self-aligned manner in the DRAM cell area and peripheral circuit area (FIGS. 19A-19C).

The interlayer insulation film 6 is then deposited, and the contacts 16 and 35 are formed therein. The bit line BL and interconnect lines 37 for the peripheral circuit are formed on the interlayer insulation film 6, so that the semiconductor memory shown in FIGS. 11A-11C is obtained.

As described above, the method according to the present embodiment differs from the method according to the first preferred embodiment in the depth at which the opening 41, lower diffusion layer 24 and first channel cut layer 301 are formed, however, a substantial number of steps is the same as in the first preferred embodiment.

Further, as understood from the foregoing description, the method according to the present embodiment also allows concurrent generation of the peripheral transistors, similarly to the conventional method. That is, the DRAM cells according to the present embodiment can easily be applied to the conventional semiconductor memory without any adverse influence on the peripheral circuit. Further, the dielectric layer 21 for the capacitors C1 and C2 can be formed in the same step of forming the gate oxide film 11 for the PMOS transistors T1, T2 and the gate oxide film 33 for the peripheral transistors, which can advantageously reduce the number of manufacturing steps and simplify the manufacturing method.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device having a memory cell and a peripheral circuit formed in a semiconductor substrate, said memory cell including a capacitor with a first electrode which is an impurity diffusion layer formed in said semiconductor substrate, said method comprising the steps of:

(a) forming a trench in an upper portion of said semiconductor substrate in each of a memory cell area in which said memory cell is formed and a peripheral circuit area in which said peripheral circuit is formed in said semiconductor substrate;

(b) forming an isolation insulation film in said trench in each of said memory cell area and said peripheral circuit area;

(c) forming said impurity diffusion layer to be said first electrode on an inner wall of said trench in a capacitor region in which said capacitor is to be formed in said memory cell area;

(d) removing said isolation insulation film in said capacitor region to create an opening by which the inner wall and bottom of said trench are exposed;

(e) forming a dielectric layer on the inner wall and bottom of said trench exposed by said opening; and (f) forming a second electrode on said dielectric layer including the inside of said opening, wherein said step (a) is carried out by etching using a first mask pattern formed on said semiconductor substrate as a mask, and said step (d) is carried out without removing said first mask pattern.

2. The method according to claim 1, further comprising the step of:

(g) forming a channel cut layer of opposite conductivity type to said impurity diffusion layer in the vicinity of the bottom of said opening in said semiconductor substrate.

3. The method according to claim 2, wherein said steps (c) and (g) are carried out by ion implantation using a second mask pattern formed on said semiconductor substrate as a mask, and said step (d) is carried out by etching using said second mask pattern as a mask.

4. The method according to claim 1, further comprising the step of:

(h) further etching down the bottom of said trench exposed by said opening after said step (d) and before said step (e).

5. The method according to claim 4, wherein said step (a) is carried out by etching using a first mask pattern formed on said semiconductor substrate as a mask, and said steps (d) and (h) are carried out without removing said first mask pattern.

6. The method according to claim 4, further comprising the step of:

(i) forming a channel cut layer of opposite conductivity type to said impurity diffusion layer in the vicinity of a position to be the bottom of said trench in said semiconductor substrate after said step (h).

7. The method according to claim 6, wherein said steps (c) and (i) are carried out by ion implantation using a second mask pattern formed on said semiconductor substrate as a mask, and said steps (d) and (h) are carried out by etching using said second mask pattern as a mask.

8. The method according to claim 1, wherein each of said memory cell and said peripheral circuit has a metal-insulator-semiconductor transistor having a gate insulation film formed on said semiconductor substrate and a gate electrode formed on said gate insulation film, said step (e) includes the step of forming said gate insulation film concurrently with said dielectric layer, and said step (f) includes the step of forming said gate electrode concurrently with said second electrode.

* * * * *